US006982582B1

(12) United States Patent
Cheng

(10) Patent No.: US 6,982,582 B1
(45) Date of Patent: Jan. 3, 2006

(54) SIMPLIFIED COMPARATOR WITH DIGITALLY CONTROLLABLE HYSTERESIS AND BANDWIDTH

(75) Inventor: Yi Cheng, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 2 days.

(21) Appl. No.: 10/602,997

(22) Filed: Jun. 23, 2003

(51) Int. Cl.
*H03K 3/037* (2006.01)
*H03K 3/12* (2006.01)

(52) U.S. Cl. ......................... 327/205; 327/206; 327/77

(58) Field of Classification Search .................. 327/77, 327/78, 79, 80, 81, 82, 85, 89, 307, 205, 327/206; 330/252, 253
See application file for complete search history.

(56) References Cited

U.S. PATENT DOCUMENTS 4,670,671 A 6/1987 De Weck ..................... 327/66
5,362,994 A 11/1994 Lin ............................. 327/72
5,708,625 A * 1/1998 Sato et al. ............... 365/233.5
5,894,234 A 4/1999 Morris ........................ 327/65
5,999,044 A * 12/1999 Wohlfarth et al. .......... 327/563
6,094,075 A * 7/2000 Garrett et al. .............. 327/108
6,198,329 B1 * 3/2001 Ezell et al. ................. 327/307
6,229,350 B1 5/2001 Ricon-Mora ................. 327/77
6,307,401 B1 * 10/2001 Bridgewater, Jr. ........... 326/86
6,384,637 B1 * 5/2002 Nguyen et al. ............... 327/54
6,433,627 B1 8/2002 Ruesch ....................... 327/563
6,459,306 B1 * 10/2002 Fischer et al. ................ 327/67
6,462,588 B2 * 10/2002 Lau et al. ................... 327/108
6,504,405 B1 * 1/2003 Nguyen et al. ............... 327/67
2002/0060607 A1 * 5/2002 Forejt ......................... 330/253
2002/0070774 A1 * 6/2002 Deas et al. ................. 327/108

FOREIGN PATENT DOCUMENTS

WO WO 01/22344 A1 3/2001

OTHER PUBLICATIONS

Eklow et al., "Draft Standard for Boundary-Scan Testing of Advanced Digital Networks," IEEE P1149.6, draft 3.0g, pp. 1-70.
"IEEE Standard Test Access Port and Boundary-Scan Architecture," *IEEE Standard* 1149.1, 2001, pp 1-200.

* cited by examiner

*Primary Examiner*—Tuan T. Lam

(57) ABSTRACT

An apparatus and method of a programmable hysteresis comparator capable of producing a digital signal in response to differential input signals is disclosed. In one embodiment, the programmable hysteresis comparator includes a hysteresis offset programmable circuit that is operable to selectively provide a hysteresis offset in response to a programmable hysteresis offset control signal. The programmable hysteresis comparator further includes a comparator circuit, which is capable of receiving differential input signals. The hysteresis comparator is operable to output a digital signal in response to differential input signals and the hysteresis offset.

125 Claims, 11 Drawing Sheets

400

SIMPLIFIED COMPARATOR WITH DIGITALLY CONTROLLABLE HYSTERESIS AND BANDWIDTH

FIELD OF THE INVENTION

The present invention relates to the field of electronic circuits. More specifically, the present invention relates to comparator electronic devices.

BACKGROUND

Integrated circuit ("IC") chips are becoming more densely packed with millions of electronic components. In order to manufacture various IC chips for specific applications, new technologies have been developed to satisfy the requirements of these chips. Each technology typically requires a set of specifications, such as voltage and frequency requirements. With the increasing number of semiconductor technologies in recent years, industries and/or IEEE have adopted various standards to facilitate communications between various chips. For example, when multiple chips are mounted on a printed circuit board ("PCB"), it is critical to understand what standard each chip follows so that they can properly communicate with each other. However, with the increasing number of standards on a single PCB, testing a PCB with various IC chips becomes more difficult.

A conventional test mechanism used in the past for testing a PCB is the boundary-scan testing. For example, IEEE 1149.1 supports testing of interconnections between IC pins. Scan test is typically performed by various scan circuits, also known as scan cells. Scan cells are usually located at the edge of the chip and they typically only perform testing functions. As such, it is advantageous to design scan cells as efficiently as possible because they don't typically contribute to the general functions of the chip. Scan cells generally include various comparators, which may be used to receive and to identify input signals.

Comparators are widely used in a variety of electronic equipment to compare the voltages of two analog inputs and to provide a digital output. A conventional comparator is an amplifier with a positive and a negative input, which typically has high input impedance. A comparator usually has high gain and produces an output signal that is the amplified difference of the positive and negative input signals. In general, a conventional comparator can be used to determine if an input signal is logically above or below a reference voltage. To enhance the noise immunity for the comparator, a technique of using hysteresis is often employed to reduce the effect of noise.

A hysteresis threshold typically defines the difference between "no input" and "input." The terms of hysteresis threshold, hysteresis offset, hysteresis offset voltage, and/or hysteresis voltage can be used interchangeably herein. A hysteresis comparator typically switches its output to one output state when the input is above one level and switches to the opposite output state when the input is below a lower level, and the output does not switch at any intermediate level.

FIG. 1 shows a schematic diagram of a conventional comparator 100 having a hysteresis offset voltage. Comparator 100 includes a comparing circuit 104 and an element 102, which generates a hysteresis offset $V_{hyst}$. The use of hysteresis can reduce an unwanted response to small signal noise. Typically, comparing circuit 104 outputs an output signal in response to input signals at input terminal In1-In2 and a hysteresis offset which is provided by element 102.

FIG. 2 is a schematic diagram of a device 200 for a conventional method of creating a hysteresis offset voltage. Device 200 includes two identical n- or n-type transistors N3–4, resistors R1–2, and current sources S3–4. If the values of transistors, resistors, and current sources are properly sized, a desirable hysteresis offset can be created across the resistor R2. Once the hysteresis offset is created, the device 200 may discard some small input signals at terminals 206–208 according to the value of the hysteresis offset.

A problem with the conventional hysteresis comparator is that it takes too many components, such as two transistors, two resistors and two current sources, to generate a hysteresis offset. Another problem with the conventional hysteresis comparator is that it is difficult to adapt new and/or different standards because each standard may require a different hysteresis offset or hysteresis delay.

Thus, it would be desirable to have a comparator that is capable of generating selectable hysteresis offsets and hysteresis delays.

SUMMARY OF THE INVENTION

A programmable comparator capable of producing a digital signal in response to differential input signals is disclosed. In one embodiment, the programmable comparator includes a programmable hysteresis offset circuit, which is configured to selectively provide a hysteresis offset in response to a programmable hysteresis offset control signal. The programmable comparator further includes a comparing circuit, which is capable of receiving differential signals through input terminals and outputting a digital signal via an output terminal. In one embodiment, a user can select a hysteresis offset to enhance the noise immunity.

In another embodiment, the programmable comparator includes a programmable hysteresis delay circuit that is operable to selectively provide a hysteresis delay in response to a programmable hysteresis delay control signal. The comparing circuit is capable of outputting digital information in response to the differential input signals and the hysteresis delay. In this embodiment, a user can select a hysteresis delay out of multiple possible hysteresis delays to increase the noise immunity.

In another embodiment, a first input transistor includes a first terminal, a second terminal and a gate terminal. The gate terminal of the first input transistor is connected to a first input and the first terminal of the first input transistor is electrically connected to a first reference voltage via a first electrical path. The first electrical path includes a current source and a resistor to generate a hysteresis offset. A second input transistor has a first terminal, a second terminal and a gate terminal. The gate terminal of the second input transistor is connected to a second input and the first terminal of the second input transistor is electrically connected to the first reference voltage via a second electrical path. The first electrical path including a current source. An output is capable of being pulled toward the first reference voltage or a second reference voltage depending in part whether the hysteresis offset has been exceeded.

Additional features and benefits of the present invention will become apparent from the detailed description, figures and claims set forth below.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Figure 1:
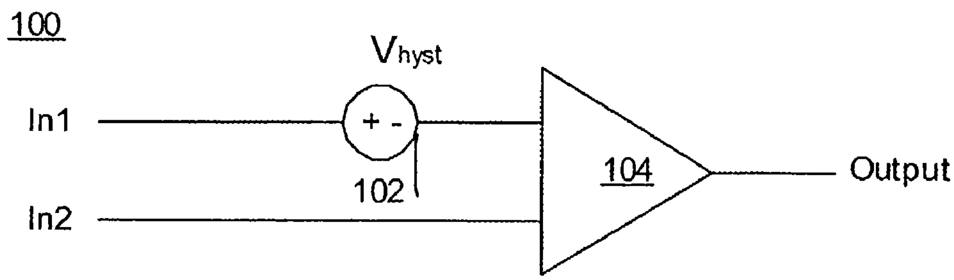
FIG. 1 shows a schematic diagram of a conventional comparator having a hysteresis offset voltage.
Figure 2:
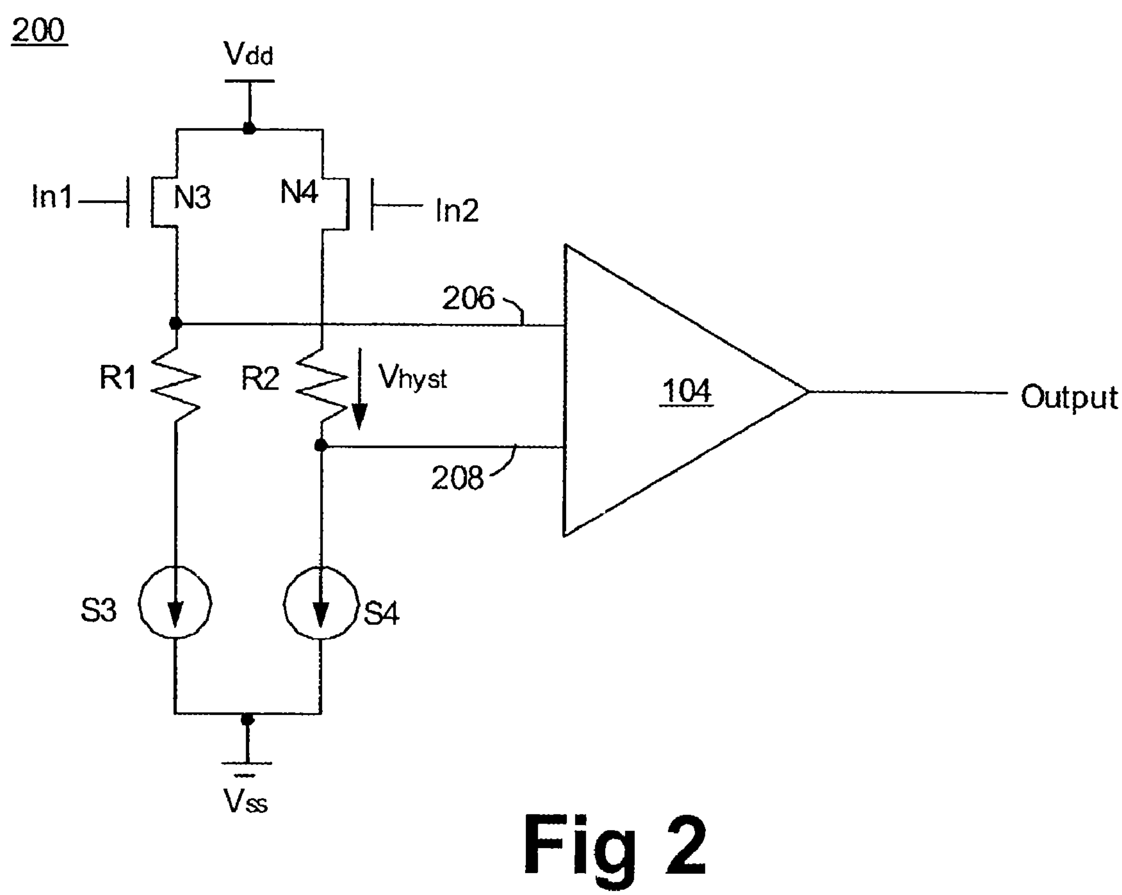
FIG. 2 is a schematic diagram of a device for a conventional method of creating a hysteresis offset voltage.

A method and apparatus of a programmable comparator capable of outputting a digital signal in response to differential input signals and programmable hysteresis references are disclosed. In one aspect, hysteresis references include a hysteresis offset and a hysteresis delay. In the following description, for purposes of explanation, numerous specific details are set forth to provide a thorough understanding of the present invention. It will be apparent, however, to one skilled in the art that these specific details may not be required to practice the present invention. In other instances, well-known circuits and devices are shown in block diagram form to avoid obscuring the present invention.

It is understood that the present invention may contain transistor circuits that are readily manufacturable using well-known art, such as for example CMOS ("complementary metal-oxide semiconductor") technology, or other semiconductor manufacturing processes. In addition, the present invention may be implemented with other manufacturing processes for making digital and system devices.

In the following description of the embodiments, substantially the same parts are denoted by the same reference numerals.

The present invention discloses a method and an apparatus of a programmable comparator that is capable of producing a digital output signal in response to differential input signals with adjustable and/or user programmable hysteresis information. The programmable comparator includes a programmable hysteresis offset circuit. The comparator produces an output signal that is the amplified difference of the input signals. A comparator, in one aspect, can be used as a differential receiver to determine if an input signal is logically above or below a reference voltage. In one embodiment, the programmable hysteresis offset circuit selectively provides a hysteresis offset according to the hysteresis offset control signal. The terms hysteresis offset, hysteresis voltage, hysteresis reference voltage, and hysteresis threshold can be used interchangeably herein.

Figure 3A:
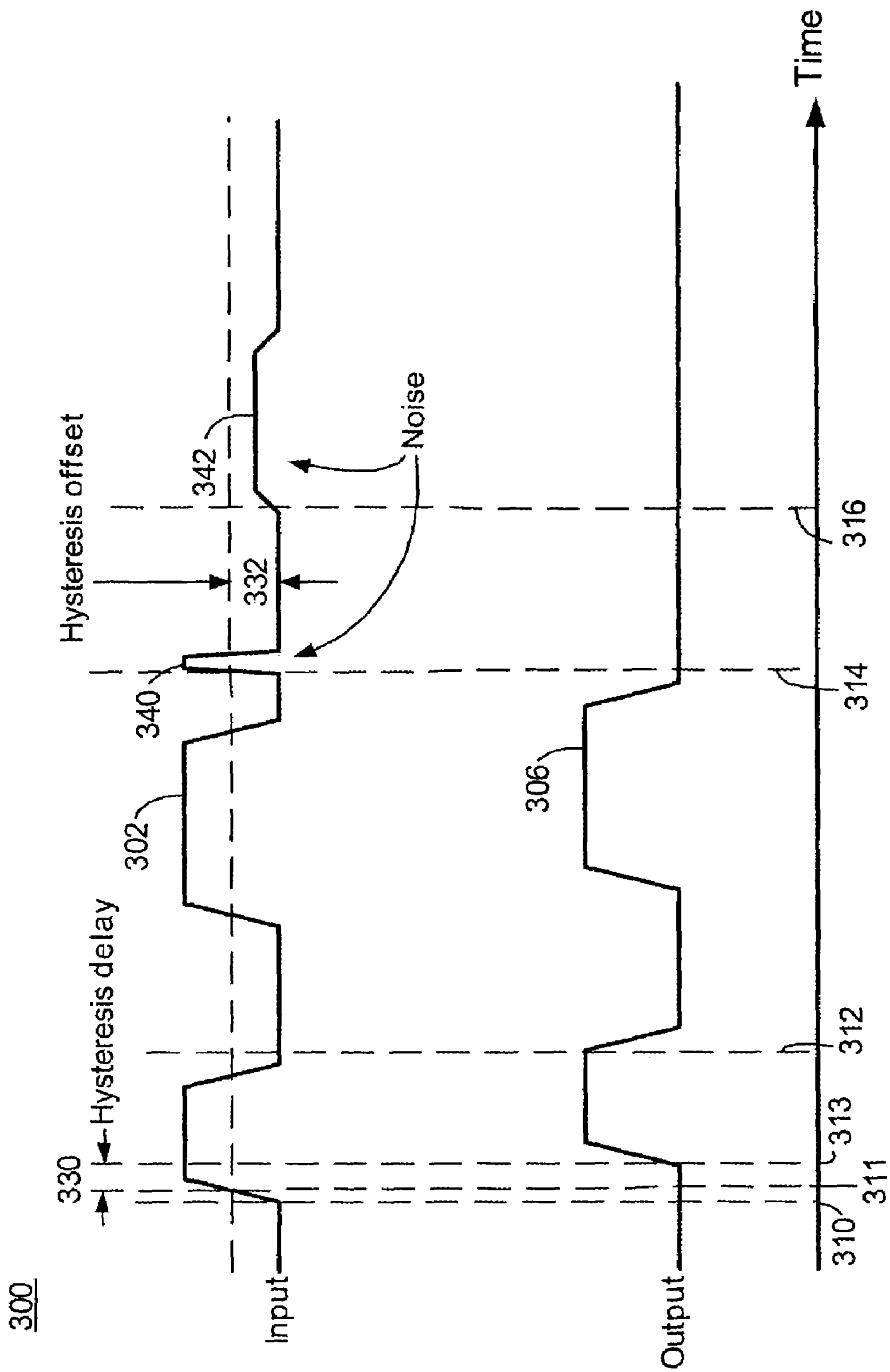
FIGS. 3A and 3B are timing diagrams illustrating digital output waveforms in response to mixed signal input waveforms in accordance with one embodiment of the present invention.

FIG. 3A is a timing diagram 300 illustrating a digital output waveform in response to a mixed signal in accordance with one embodiment of the present invention. Mixed signals, in one embodiment, include digital and analog signals. Timing diagram 300 includes an input signal (waveform) 302 and an output signal (waveform) 306. Input signal 302 may include digital pulses, analog pulses (not shown in FIG. 3A), and intermittent noise pulses 340–342. In one embodiment, output signal 306 is always in digital waveform regardless of whether the input signal contains digital and/or analog pulses.

Timing diagram 300 shows a hysteresis offset 332 and hysteresis delay 330. As mentioned earlier, the use of hysteresis offset 332 is to reduce an unwanted response to small signals generated by noise. The use of hysteresis delay 330 is to reduce noise effects from voltage spikes. In other words, the utilization of hysteresis offset 332 causes the comparator to ignore small-amplitude pulses with sufficient duration while the utilization of hysteresis delay 330 causes the comparator to disregard large-amplitude pulses with insufficient duration.

Referring to FIG. 3A, at time 310, input signal 302 starts to rise. Input signal 302 reaches the voltage of hysteresis offset 332 at time 311. At time 313, output signal 306 starts to respond to input signal 302 after the pulse of input signal 302 sustains as long as hysteresis delay 330. At time 312, output signal 306 starts to fall in response to the fall of input signal 302. At time 314, a voltage spike 340 appears at input signal 302 but it fails to affect output signal 306 because the duration of the spike 340 is not long enough. At time 316, a noise pulse 342 appears at input signal 302 and it also fails to affect the output signal 306 because it does not have enough voltage amplitude.

The timing diagram 300 shown in FIG. 3A illustrates an example of a comparator, which employs a hysteresis offset for reducing the effect of small-amplitude noise and uses a hysteresis delay for reducing the effect of large-amplitude pulses of insufficient duration.

Figure 3B:
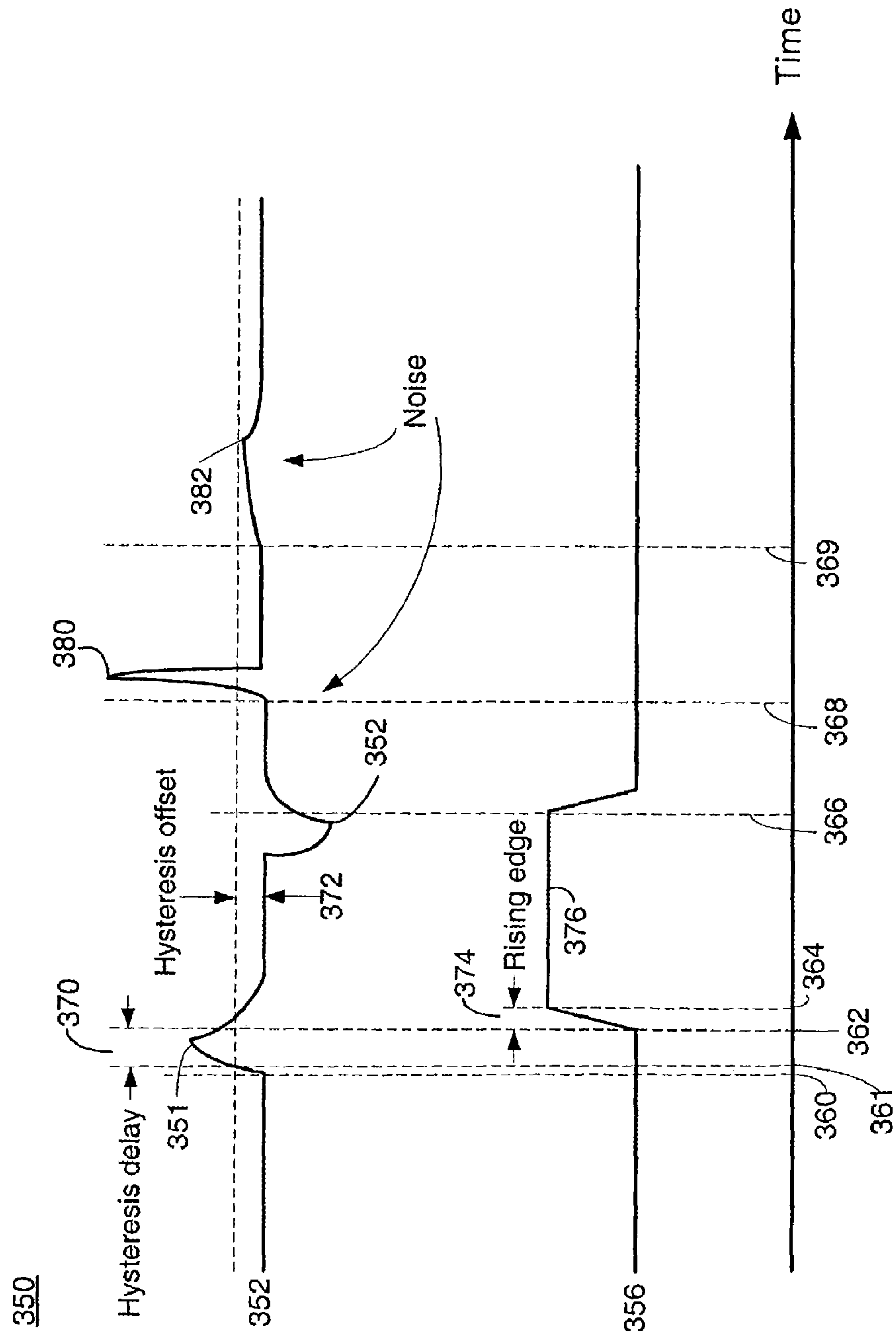

FIG. 3B is a timing diagram 350 illustrating a digital output waveform in response to an analog signal in accordance with one embodiment of the present invention. It should be noted that the input signal may also be a mixed signal and/or digital signal. Referring to FIG. 3B, timing diagram 350 includes an input signal (waveform) 352 and an output signal (waveform) 356. Input signal 352, in one embodiment, includes analog pulses 351–352 and intermittent noise pulses 380–382. Timing diagram 350 shows a hysteresis offset 372 and hysteresis delay 370. As mentioned earlier, the use of hysteresis offset 372 is to reduce an unwanted response to small signals generated by noise. The use of hysteresis delay 370 is to reduce noise effects from voltage spikes.

In one embodiment, output signal 356 is always in digital waveform even though the input signals are analog pulses. For an AC-coupled receiver, positive analog pulse triggers the rising edge of the digital output signal and negative analog pulse triggers the falling edge of the digital output signal. In another embodiment, a first analog signal triggers the rising edge of the digital output signal and a second analog signal triggers the falling edge of the digital output signal. In one embodiment, output signal 356 changes its digital waveform in response to analog input signals, which are typically in a range between 50 and 300 millivolts (mV).

Referring to FIG. 3B, at time 360, input signal 352 starts to rise. Input signal 352 reaches the voltage of hysteresis offset 372 at time 361. At time 362, output signal 356 starts to respond to input signal 352 after the pulse 351 of input signal 352 sustains as long as hysteresis delay 370. As mentioned earlier, for an AC coupled device, a positive analog pulse 351 triggers the rising edge of the digital output signal 374. Once the output signal 356 reaches high state 376, it stays high until the next analog pulse. At time 366, output signal 356 starts to change its waveform (a falling transition) in response to a negative analog pulse 352 of input signal 352. At time 368, a voltage spike 380 appears at input signal 352 but it fails to affect output signal 356 because the duration of the spike 380 is not long enough. At time 369, a noise pulse 382 appears at input signal 352 and it also fails to affect the output signal 356 because it does not have enough voltage amplitude.

Figure 10:
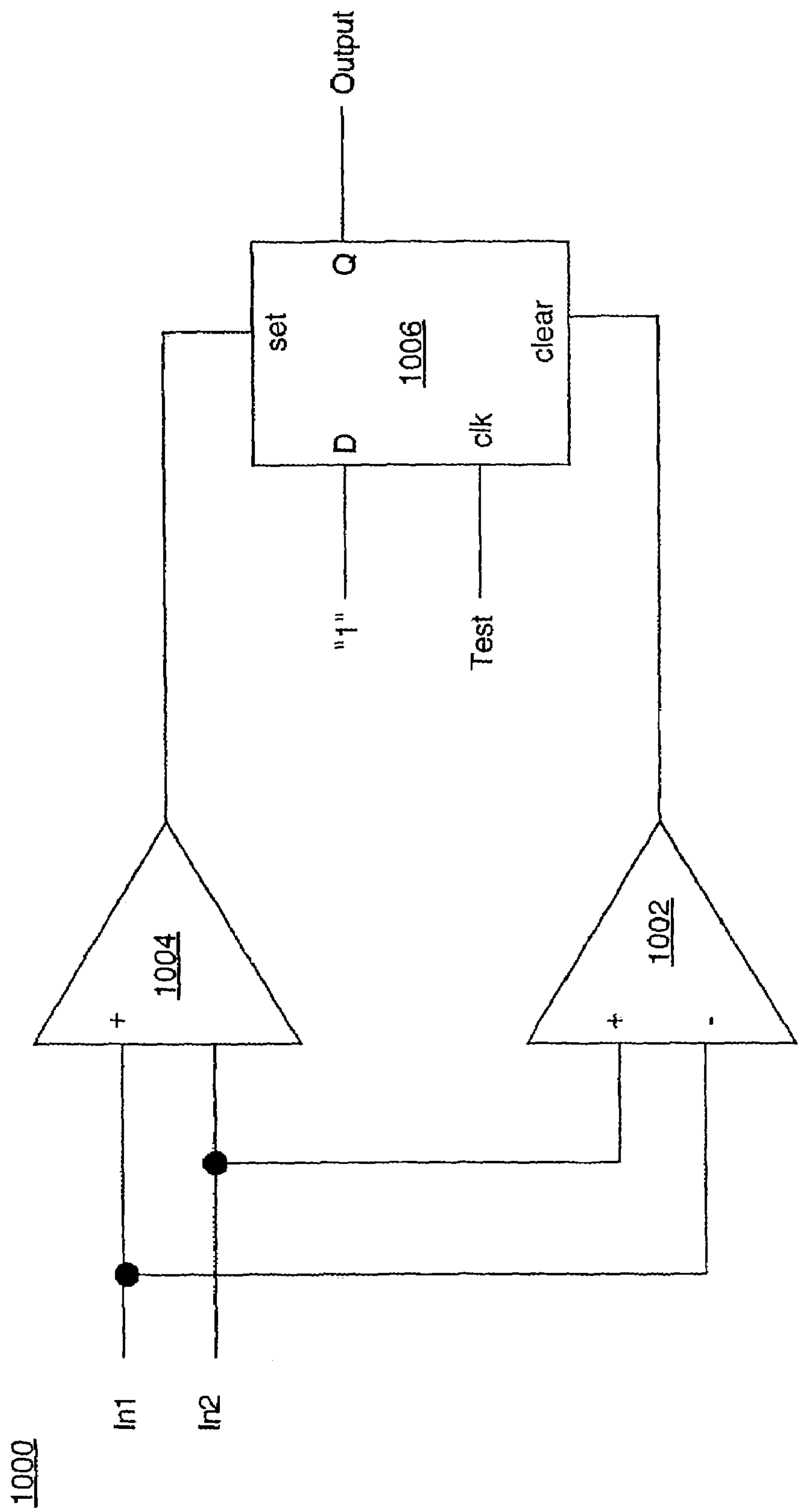
FIG. 10 is a block diagram illustrating a fixed signal comparator for boundary-scan testing in accordance with one embodiment of the present invention.

The timing diagram 350 shown in FIG. 3B illustrates an example of a comparator (as shown in FIG. 10 below), which employs a hysteresis offset for reducing the effect of small-amplitude noise and uses a hysteresis delay for reducing the effect of large-amplitude pulses of insufficient duration.

Figure 4:
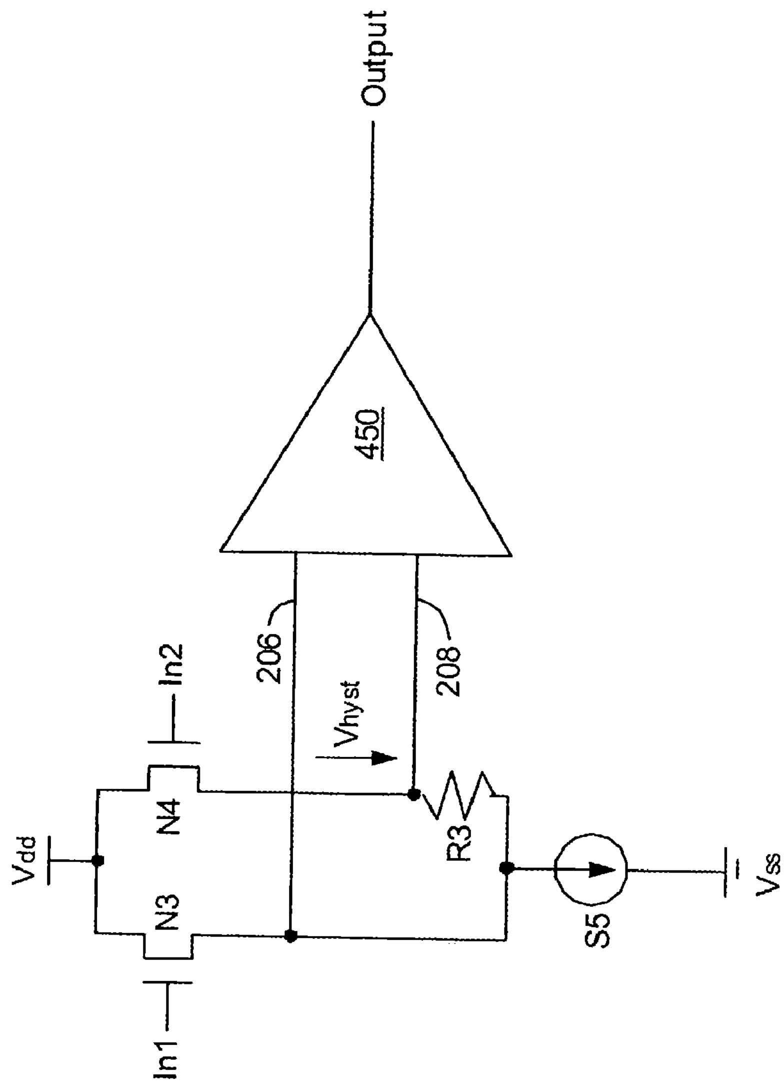
FIG. 4 is a schematic diagram illustrating an implementation of a hysteresis comparator in accordance with one embodiment of the present invention.

FIG. 4 is a schematic diagram of a comparator 400 illustrating an implementation of a hysteresis offset in accordance with one embodiment of the present invention. Comparator 400 includes a comparing circuit 450, two n-transistors N3, N4, a resistor R3, and a source current S5. A first input terminal In1 is connected to the gate terminal of N3 and a second input terminal In2 is connected to the gate terminal of N4. An N-transistor is referred to as an n-type transistor or N-MOS (metal-oxide-semiconductor) transistor.

In one embodiment, n-transistors N3 and N4 are similarly sized so that they behave similarly. The source terminals of N3 and N4 are connected to a first reference potential. The first reference potential may be Vdd, positive potential, and/or positive voltage supply. The drain terminal of N3 is coupled to a node, which is also connected with terminal 206 of comparing circuit 450, a first terminal of current source S5 and a first terminal of resistor R3. The drain terminal of N4 is coupled to another node, which is also connected to terminal 208 of comparing circuit 450 and a second terminal of resistor R3. The second terminal of current source S5 is coupled to a second reference potential Vss, which may be a ground reference potential, a zero volt power supply, and/or negative volt power supply.

In one aspect, comparing circuit 450 produces a logic zero output signal if the input signals on terminals 206–208 are the same. Comparing circuit 450, however, outputs a logic one output signal if the input signals on terminal 206–208 are different. In order to minimize unwanted change of output signals, a hysteresis offset is employed to reduce the switching due to the glitches, noises or voltage spikes. The use of components resistor R3 and current source S5 provides a hysteresis voltage ($V_{hyst}$) across the resistor R3, wherein $V_{hyst}$ can be expressed as follows:

$$V_{hyst}=R*I$$

Where R is the resistance value of resistor R3 and I is the current value of current source S5. As such, in one embodiment, the output signal from comparing circuit 450 is not going to switch unless the input signal is greater than $V_{hyst}$.

Figure 5:
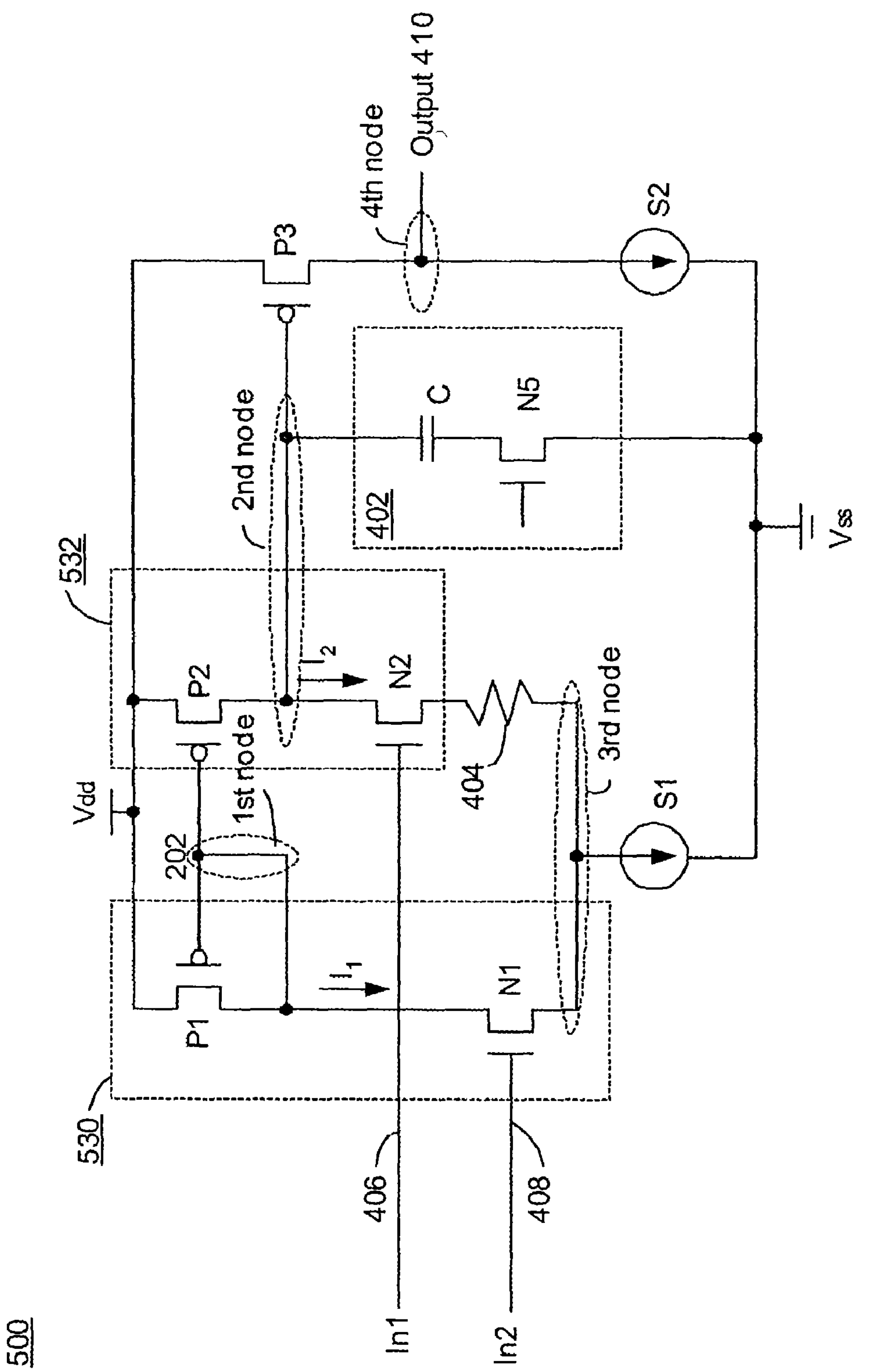
FIG. 5 is a schematic diagram illustrating a comparator capable of receiving input signals in response to a hysteresis offset and a hysteresis delay in accordance with one embodiment of the present invention.

FIG. 5 is a schematic diagram illustrating a comparator 500 employing a hysteresis offset and a hysteresis delay in accordance with one embodiment of the present invention. Referring back to FIG. 5, comparator 500 includes three p-transistors P1–3, three n-transistors N1, N2, N5, two current sources S1–2, one resistor 404 and one capacitor C. The gate terminals of P1 and P2 are coupled to a first node. The drain terminal of P1 and source terminal of N1 are also coupled to the first node. The drain terminal of P2 and source terminal of N2 are coupled to a second node. A first terminal of capacitor and the gate terminal of P3 are coupled to the second node. The source terminals of P1, P2, and P3 are coupled to a first reference potential or Vdd. The drain terminal of N2 is coupled to a first terminal of resistor 404. The second terminal of resistor 404 is coupled to a third node. The drain terminal of N1 and the first terminal of S1 are coupled to the third node. The drain terminal of P3 and the first terminal of S2 are coupled to a fourth node and the fourth node also provides an output terminal 410. The second terminal of C is coupled to the source terminal of N5. The drain terminal of N5 and the second terminals of S1–2 are coupled to Vss or ground reference potential.

In one embodiment, components P1–3 and N1–2 provide a comparing function. To implement an accurate comparing function, P1 and P2 have substantially similar parameters so that both P1 and P2 behave similarly under similar conditions. For the same reason, N1 and N2 are also sized to have similar parameters. In operation, output terminal 410 outputs a signal with logic one ("1") when input signals at the input terminals In1-2 are different. Similarly, output terminal 410 outputs a signal with logic zero ("0") when input signals at the input terminals In1-2 are substantially the same. In one embodiment, resistor 404 and S1–2 are configured to create a hysteresis offset or hysteresis voltage. Capacitor C and N5 are configured to provide a hysteresis delay.

Referring to FIG. 5, block 530 behaves substantially the same as block 532 because, as discussed earlier, the components in block 530 have similar parameters as components in block 532. By adding a resistor 404 on the path of block 532, it adds impedance on the path of block 532 and effectively reduces the current flow 12 through block 532. Comparing with block 532, block 530 contains less impedance on its path and consequently, $I_1$ in block 530 is greater than $I_2$ in block 532. As such, a higher input signal at In1 406 is needed to turn on P3. Since P3 determines the output value at the output terminal 410, controlling the value of $I_2$ becomes important because it drives P3. In one embodiment, S1 is used to control the speed of comparator 500. In another embodiment, S2 is used to control the output value at the output terminal 410. When S2 is dominant, the output value at the output terminal 410 is logic zero and when P3 is dominant, the output signal at the output terminal 410 is logic one.

Block 402 contains capacitor C and transistor N5, which are designed to provide a hysteresis delay. In one embodiment, transistor N5 is used to turn on or off the capacitor C. In one embodiment, block 402 is configured to apply a load on the $2^{nd}$ node. Referring to the layout shown in FIG. 5, by increasing the load on the $2^{nd}$ node, it delays switching time for P3. In other words, block 402 controls the switching speed of P3. In general, more loading on the $2^{nd}$ node, requires a wider pulse for an input signal to be valid. The relationship between bandwidth frequency and hysteresis delay $T_{hyst}$, can be expressed as follows:

$$f_{BW} \leq T_{hyst}(2\pi) \times \ln[1-(V_{hyst}/V_{min})]$$

where $f_{BW}$ is the bandwidth frequency, $V_{hyst}$ is hysteresis voltage, $V_{min}$ is the minimal voltage, and $T_{hyst}$ is hysteresis delay.

Referring back to FIG. 5, the capacitor C in block 402 is used to apply a load on the $2^{nd}$ node, which controls the rate of switching for P3. In other words, the loading of capacitance from the capacitor C is directly related to the speed of P3. The capacitor C, in one embodiment, is a MOS capacitor, which is also known as a gate capacitance device. In another embodiment, the capacitor C can be turned on or off by a switching device, such as N5. It should be noted that other methods might be used to provide a hysteresis delay. For example, n-transistor may be sized to achieve a similar function as a capacitor. Also, other types of switches such as invertors and p-transistors might be used to perform a switching function to control the capacitor C.

Figure 6:
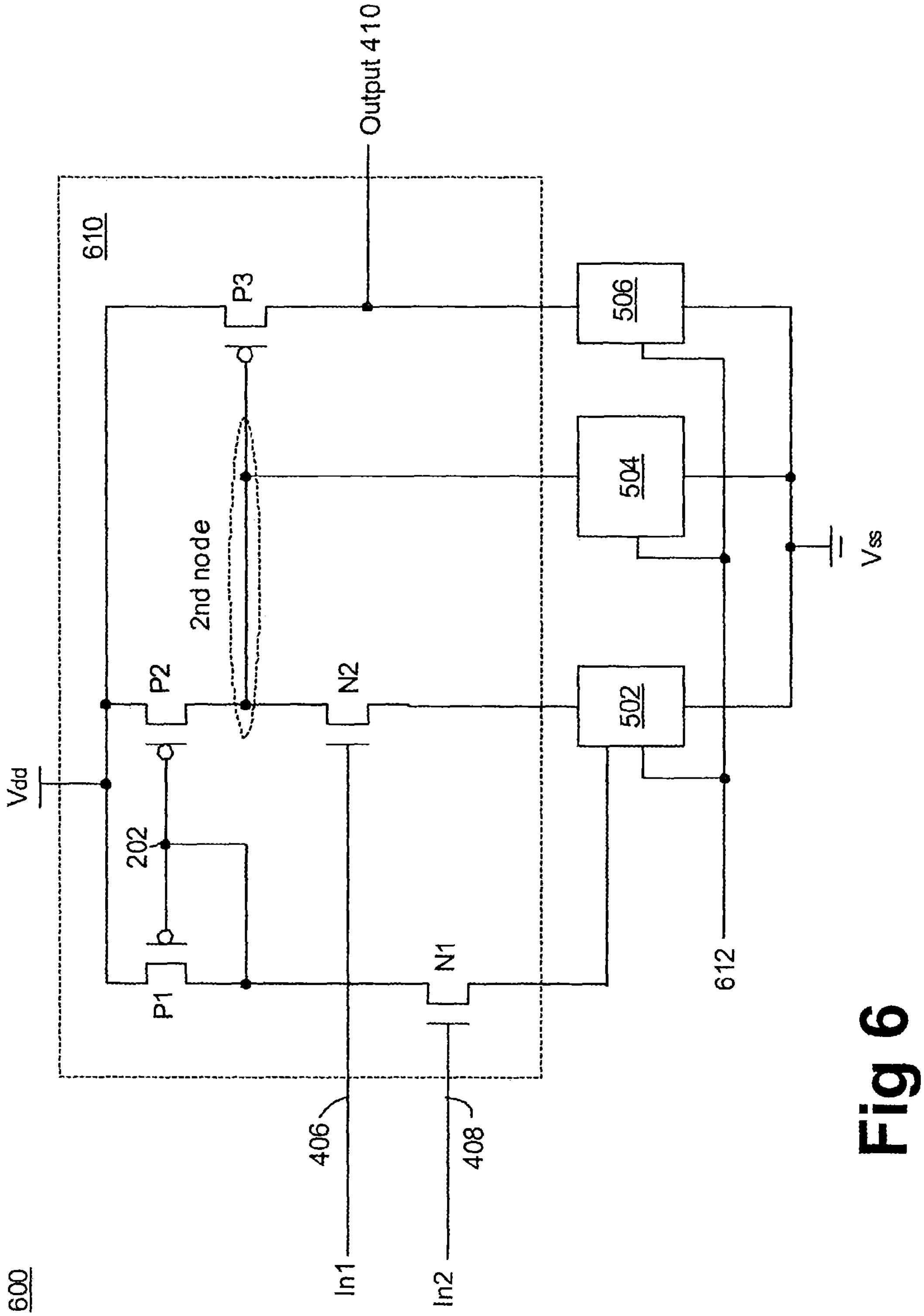
FIG. 6 is a block diagram illustrating a hysteresis comparator capable of receiving input signals in response to a programmable hysteresis offset and a programmable hysteresis delay in accordance with one embodiment of the present invention.

FIG. 6 is a block diagram illustrating a hysteresis comparator 600 capable of receiving input signals in response to a programmable hysteresis offset and a programmable hysteresis delay in accordance with one embodiment of the present invention. Comparator 600 includes a comparing circuit 610, a programmable hysteresis offset circuit 502, a programmable hysteresis delay circuit 504, and a programmable output control circuit 506. Comparing circuit 610, for one embodiment, is similar to the comparing circuit illustrated in FIG. 5. It should be noted that the underlying concept of the present invention would not change if other types of comparing circuits were used in block 610.

Referring back to FIG. 6, the input terminals 406–408 are coupled to the gate terminals of n-transistors N1–2, respectively. Programmable hysteresis offset circuit 502 is coupled to n-transistors N1–2 for providing a hysteresis offset. Programmable output control circuit 506 is coupled to p-transistor P3 for facilitating output signals at the output terminal 410. Programmable hysteresis delay circuit 504 is coupled to the $2^{nd}$ node for providing a hysteresis delay. Programmable hysteresis offset circuit 502, programmable hysteresis delay circuit 504, and programmable output control circuit 506 are controlled and/or programmed by programmable control signals carried via programmable control terminal 612. In one embodiment, programmable control terminal 612 carries multiple control signals wherein control signals are divided into three portions. The first portion is dedicated to control programmable hysteresis offset circuit 502. The second portion is dedicated to control programmable hysteresis delay circuit 504 and the third portion is dedicated to program programmable output control circuit 506. In another embodiment, programmable control signals are shared between programmable hysteresis offset circuit 502, programmable hysteresis delay circuit 504, and programmable output control circuit 506. The programmable control signals may be provided by a user, a processor, a memory device, and/or a combination of processor and memory devices. It should be noted that memory device may include flash memory, RAM (random-access memory), ROM (read-only memory), and EEPROM (electronically erasable programmable read-only memory).

Programmable hysteresis offset circuit 502 provides user selectable hysteresis offset for comparator 600. In one embodiment, programmable hysteresis offset circuit 502 includes a resistor and multiple current sources. Depending on the chip standard, a user can select a current source or a combination of current sources to provide a hysteresis offset. The user may make the selection through a processor or a memory device that resides in the system. In another embodiment, programmable hysteresis offset circuit 502 includes multiple resistors and one current source. Depending on the chip standard, a user may select a resistor or a combination of resistors to provide a hysteresis offset. In yet another embodiment, programmable hysteresis offset circuit 502 includes multiple resistors and multiple current sources. A user can select a pair of resistors and current sources or a combination of resistors and current sources to provide a hysteresis offset. It should be noted that the underlying concept of the present invention would not change if other types of programmable techniques or additional elements were employed in programmable hysteresis offset circuit 502.

Programmable output control circuit 506, in one embodiment, is configured to selectively provide control of the output signals at the output terminal 410. Due to the various protocols and standards, the output signals, in one embodiment, need to be controlled with respect to the hysteresis offset. A user, in one embodiment, controls programmable output control circuit 506 via the programmable control signal to determine how much P3 needs to be turned on before P3 drives the output signal. Programmable output control circuit 506, in one embodiment, is adjusted together with programmable hysteresis offset circuit 502 to produce a more desirable hysteresis offset. It should be apparent to one skilled in the art that programmable output control circuit 506 can be integrated into programmable hysteresis offset circuit 502.

Programmable hysteresis delay circuit 504 provides user selectable hysteresis delay $T_{hyst}$ for enhancing noise immunity. Programmable hysteresis delay circuit 504, in one embodiment, includes various capacitors and switchers wherein the switchers are used to selectively turn on and off capacitors. The switchers are controlled by the programmable control signals. Programmable control terminal 612, in one embodiment, includes multiple wires wherein each wire may control a device or a set of devices such as current sources and capacitors. A user may selectively turn on or off a capacitor through a processor or a memory device. It should be noted that the underlying concept of the present invention would not change if other types of programmable techniques or additional elements were employed in programmable hysteresis delay circuit 504.

Figure 7:
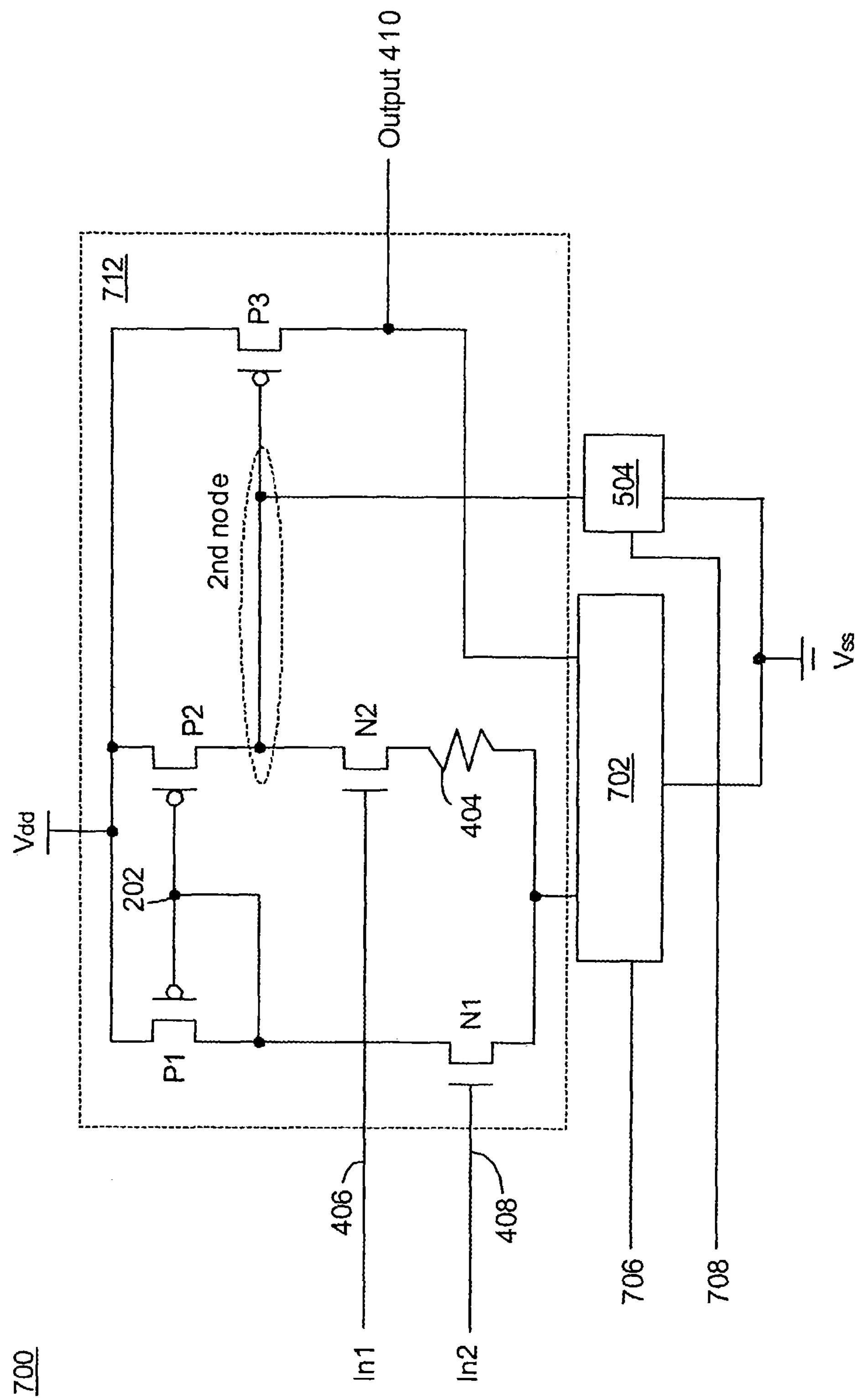
FIG. 7 is a block diagram illustrating a programmable comparator having a resistance component in accordance with one embodiment of the present invention.

FIG. 7 is a block diagram illustrating a programmable comparator 700 having a resistance component in accordance with one embodiment of the present invention. Comparator 700 includes a comparing circuit 712, a programmable hysteresis offset circuit 702, and a programmable hysteresis delay circuit 504. Programmable hysteresis delay circuit 504, as described earlier, is used to provide a hysteresis delay in response to control signals transmitted by programmable control terminal 708. The control signals transmitted by programmable control terminal 708, in one embodiment, are provided by a user, a processor, and/or memory cells.

Comparing circuit 712, in one embodiment, includes similar components as comparing circuit 610 shown in FIG. 6, except an additional resistor 404. Comparing circuit 712 performs a comparing function with a hysteresis offset and a hysteresis delay. Hysteresis offset, in one embodiment, is created through resistor 404 and programmable hysteresis offset circuit 702. Programmable hysteresis offset circuit 702, in one embodiment, includes a programmable current source and a programmable output control current source.

The programmable current source is coupled with resistor 404 to furnish hysteresis offset while the programmable output control current source is coupled to P3 to provide control of the output signal. The programmable current source and programmable output control current source are controlled or selected by control signals carried by control terminals 706.

In one embodiment, the control signals carried by control terminals 706 are used and decoded by both programmable current source and programmable output control current source. In another embodiment, the control signals are divided into two portions wherein a portion of the signals is dedicated to programmable current source while another portion of the signals is dedicated to programmable output control current source. Control terminals 706 and 708 may be merged into one control terminal. It should be apparent to one skilled in the art that programmable hysteresis offset circuit 702 may contain circuits that perform current source functions. It should be further noted that the underlying concept of the present invention would not change if additional components such as inductance device, capacitance devices, and transistors may be added or removed from comparator 700.

Figure 8:
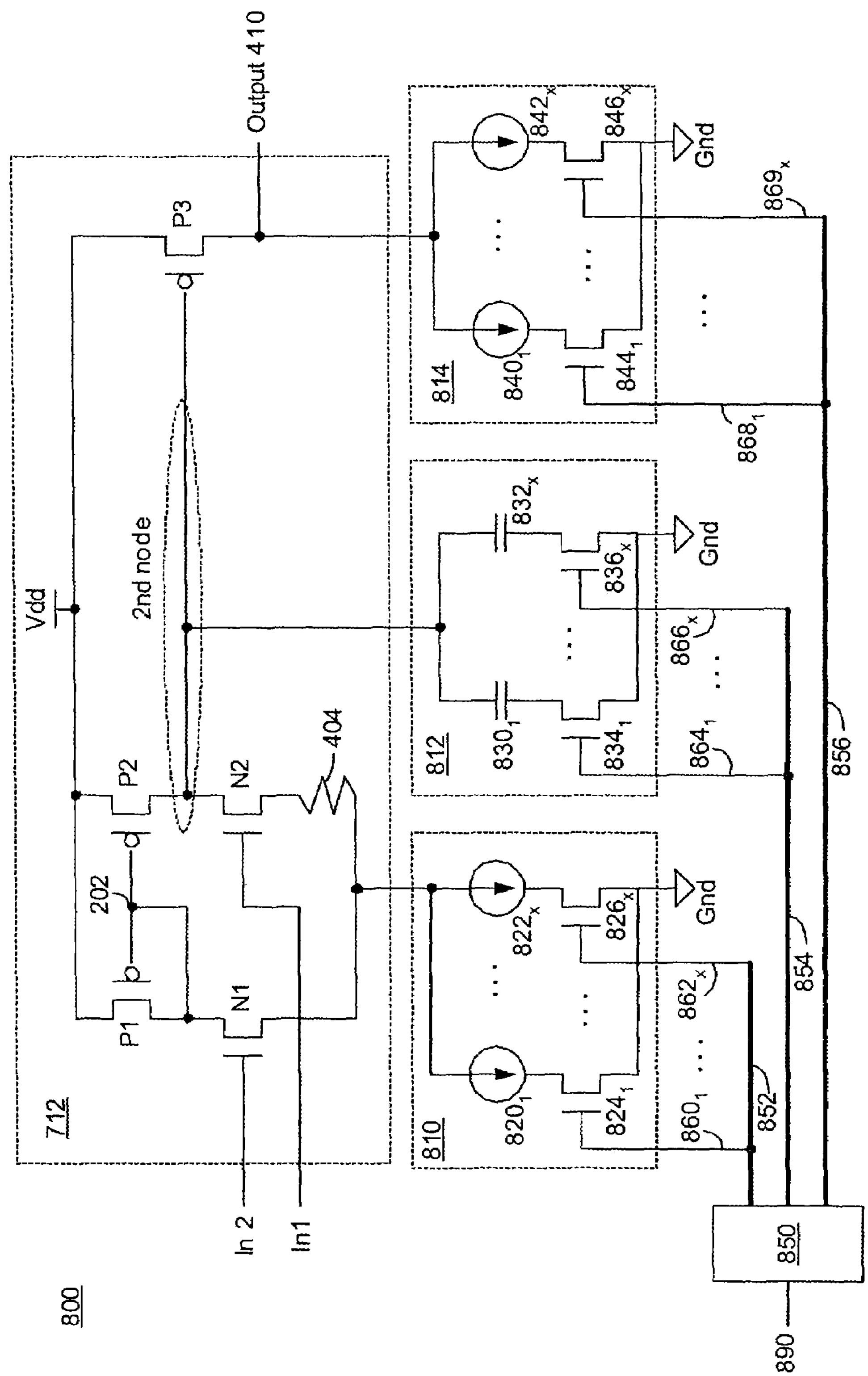
FIG. 8 is a detailed circuit diagram illustrating a comparator having multiple programmable blocks in accordance with one embodiment of the present invention.

FIG. 8 is a detailed circuit diagram illustrating a comparator 800 having programmable blocks 810–814 in accordance with one embodiment of the present invention. Block 810 illustrates a device layout of a programmable hysteresis offset circuit. Block 812 illustrates a device layout of a programmable hysteresis delay circuit and block 814 illustrates a device layout of a programmable output control circuit. Control block 850 provides control channels 852–856 for programming block 810–814, respectively.

Control block 850 may be activated or controlled by signals transmitted through control block terminal 890. In one embodiment, control channels 852 include multiple control wires $\mathbf{860}_1$–$\mathbf{862}_x$ and control channel 854 includes control wires $\mathbf{864}_1$–$\mathbf{866}_x$, in which x can be any integer numbers. Also, control channel 856 includes control wires $\mathbf{868}_1$–$\mathbf{869}_x$. Control block 850, in one embodiment, provides control signals in response to the input signals on control block terminal 890. In another embodiment, control block 850 provides control signals through memory cells within control block 850. Various types of volatile and/or non-volatile memory may be used.

In one embodiment, block 810 includes multiple current sources $\mathbf{820}_1$–$\mathbf{822}_x$ and multiple switchers $\mathbf{824}_1$–$\mathbf{826}_x$ for providing a hysteresis offset. In other words, block 810 can have one current sources or x number of current sources in which x can be a large number. Multiple n-transistors, in this embodiment, are used as switchers $\mathbf{824}_1$–$\mathbf{826}_x$. A function of switcher is to switch the current source on or off according to the signals on the control wires. For example, if control wire 860, provides a logic high signal, it turns on n-transistor $\mathbf{824}_1$ and subsequently activates current source $\mathbf{820}_1$. On the other hand, if control wire $\mathbf{862}_x$ provides a logic low signal, both n-transistor $\mathbf{826}_x$ and current source $\mathbf{822}_x$ are turned off.

Block 812 includes multiple capacitors $\mathbf{830}_1$–$\mathbf{832}_x$ for providing a hysteresis delay. Block 812 also includes multiple switchers $\mathbf{834}_1$–$\mathbf{836}_x$ that associate with each capacitor for controlling the capacitors. In this embodiment, n-transistors are used as switchers $\mathbf{834}_1$–$\mathbf{836}_x$ to turn on and off capacitors $\mathbf{830}_1$–$\mathbf{832}_x$. Signals carried by control wires $\mathbf{864}_1$–$\mathbf{866}_x$ control switchers $\mathbf{834}_1$–$\mathbf{836}_x$ wherein switchers $\mathbf{834}_1$–$\mathbf{836}_x$ control capacitors $\mathbf{830}_1$–$\mathbf{832}_x$. For example, if signals control wires $\mathbf{864}_1$–$\mathbf{866}_x$ are logic low, n-transistors $\mathbf{834}_1$–$\mathbf{836}_x$ are turned off and consequently, capacitors $\mathbf{830}_1$–$\mathbf{832}_x$ are also turned off. In another embodiment, capacitors $\mathbf{830}_1$–$\mathbf{832}_x$ can be turned on or off in any combination. In other words, a user can turn on more than one capacitor at one time.

Block 814 includes multiple current sources $\mathbf{840}_1$–$\mathbf{842}_x$ with associated switchers $\mathbf{844}_1$–$\mathbf{846}_x$ for controlling output signals at the output terminal 410. Multiple n-transistors are used as switchers $\mathbf{844}_1$–$\mathbf{846}_x$. A function of the switcher is to switch current source on or off according to the signals at the control wires $\mathbf{868}_1$–$\mathbf{869}_x$. For example, if control wire 866 provides a logic high signal, it turns on n-transistor 844 and subsequently activates current source 8401. On the other hand, if control wire $\mathbf{869}_x$ provides a logic low signal, which turns off n-transistor $\mathbf{846}_x$, current source $\mathbf{842}_x$ is turned off. It should be noted that the layout in block 810–814 are illustrative and it should be apparent to one skilled in the art that any layout having programmability and perform similar functions might be used in block 810–814.

Figure 9:
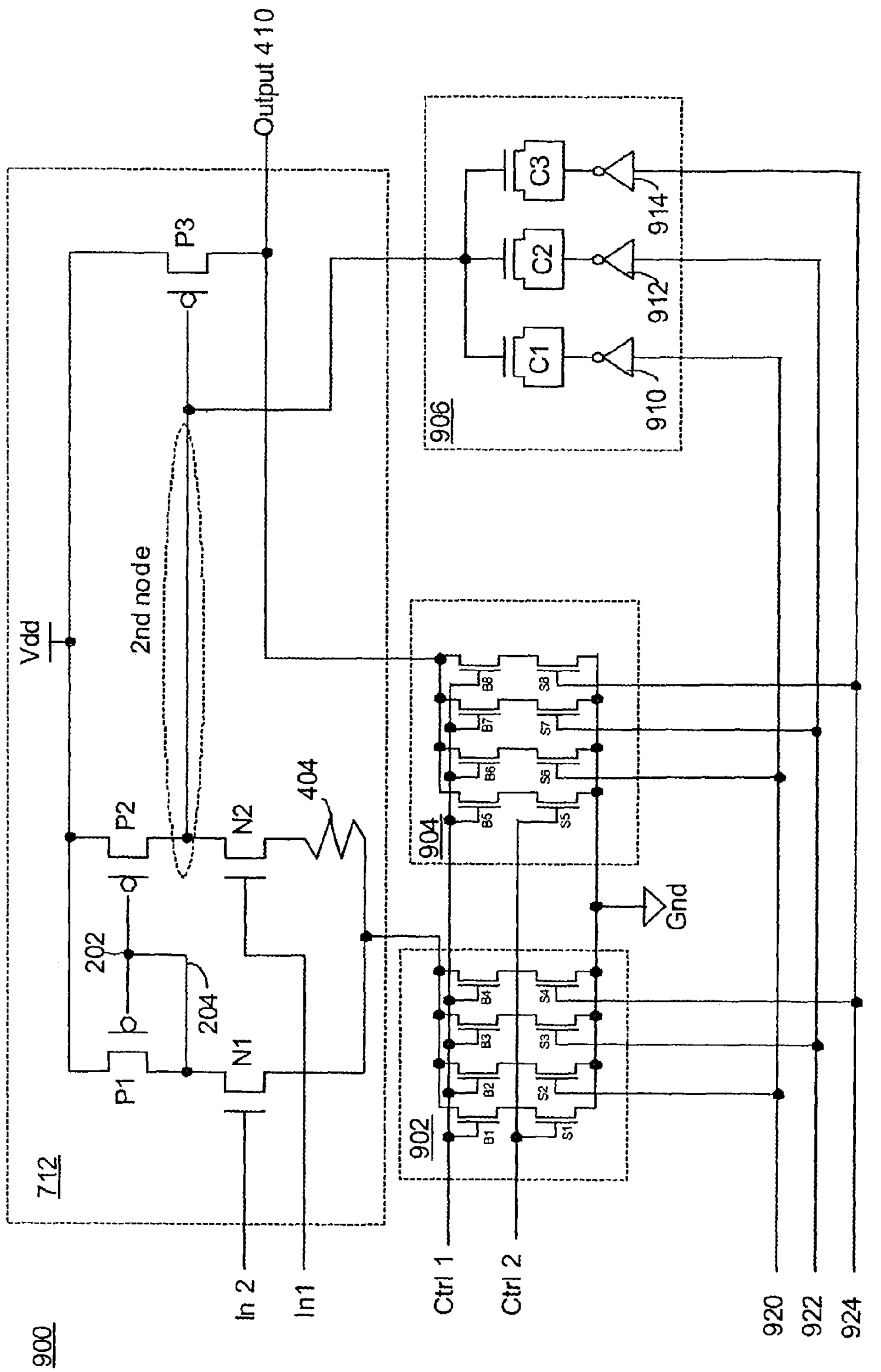
FIG. 9 is a schematic diagram illustrating a comparator having detailed programmable circuits in accordance with one embodiment of the present invention.

FIG. 9 is a schematic diagram illustrating a comparator 900 having detailed programmable circuits 902–906 in accordance with one embodiment of the present invention. Programmable block 902, in one embodiment, includes four n-transistors B1–B4 as current sources and four n-transistors S1–S4 as switchers. Programmable block 902 is coupled to resistor 404 for providing a hysteresis offset. In one embodiment, n-transistor B1, which is also known as the base or master current source, is turned on all the time because for comparator 900 to work properly, at least one current source needs to be active. Accordingly, the switcher S1 may be removed since current source B1 is not programmable. The current sources B2–B4 are programmable via switchers S2–S4, respectively. In one embodiment, the current source B2–B4 can be programmed or turned on/off in any combination.

Programmable block 904 includes four n-transistors B5–B8 as current sources and four n-transistors S5–S8 as switchers. Programmable block 904 is configured to control the output signals at the output terminal 410. In one embodiment, n-transistor B5, which is a base current source, is not programmable and accordingly, switcher S5 may be removed. Current sources B6–B8 are programmable via their switchers S6–S8. In one embodiment, current sources B6–B8 can be turned on or off in any combination.

Programmable block 906, in one embodiment, includes three MOS capacitors C1–C3 and three invertors 910–914 as switchers. Programmable block 906 is coupled to the $2^{nd}$ node to provide a hysteresis delay. MOS capacitors C1–C3 are also known as gate capacitors because the drain and source terminals of n-transistors C1–C3 are tied together. To turn on the MOS capacitor, the invertor applies a large potential on the opposite site of the gate terminals to create capacitance under the gate. It should be noted that the invertors 910–912 could be alternatively replaced with other types of switches such as n-transistors and/or p-transistors. Capacitors C1–C3 can be turned on independently or in a combination of any three capacitors C1–C3. The control signals at control terminals 920–924 determine which capacitor or capacitors should be activated.

FIG. 10 is a block diagram illustrating a fixed signal comparing device 1000 for boundary-scan testing in accordance with one embodiment of the present invention. Comparing device 1000 includes two programmable comparators 1002–1004 and one D flip-flop 1006. The output of the D flip-flop 1006 ensures a square waveform (digital information) output. In this embodiment, the output terminal of positive input comparator 1004 is coupled to the set terminal of the D flip-flop 1006 and the output terminal of negative input comparator 1002 is coupled to the clear terminal of the D flip-flop 1006.

In one embodiment, comparing device 1000 is used as a receiver in a boundary-scan test setting and is capable of providing a digital square waveform output regardless of whether the input signal is DC or AC coupling. Furthermore, because the comparators 1002–1004 are programmable, a user can program the device 1000 according to the required standards under the test.

Figure 11:
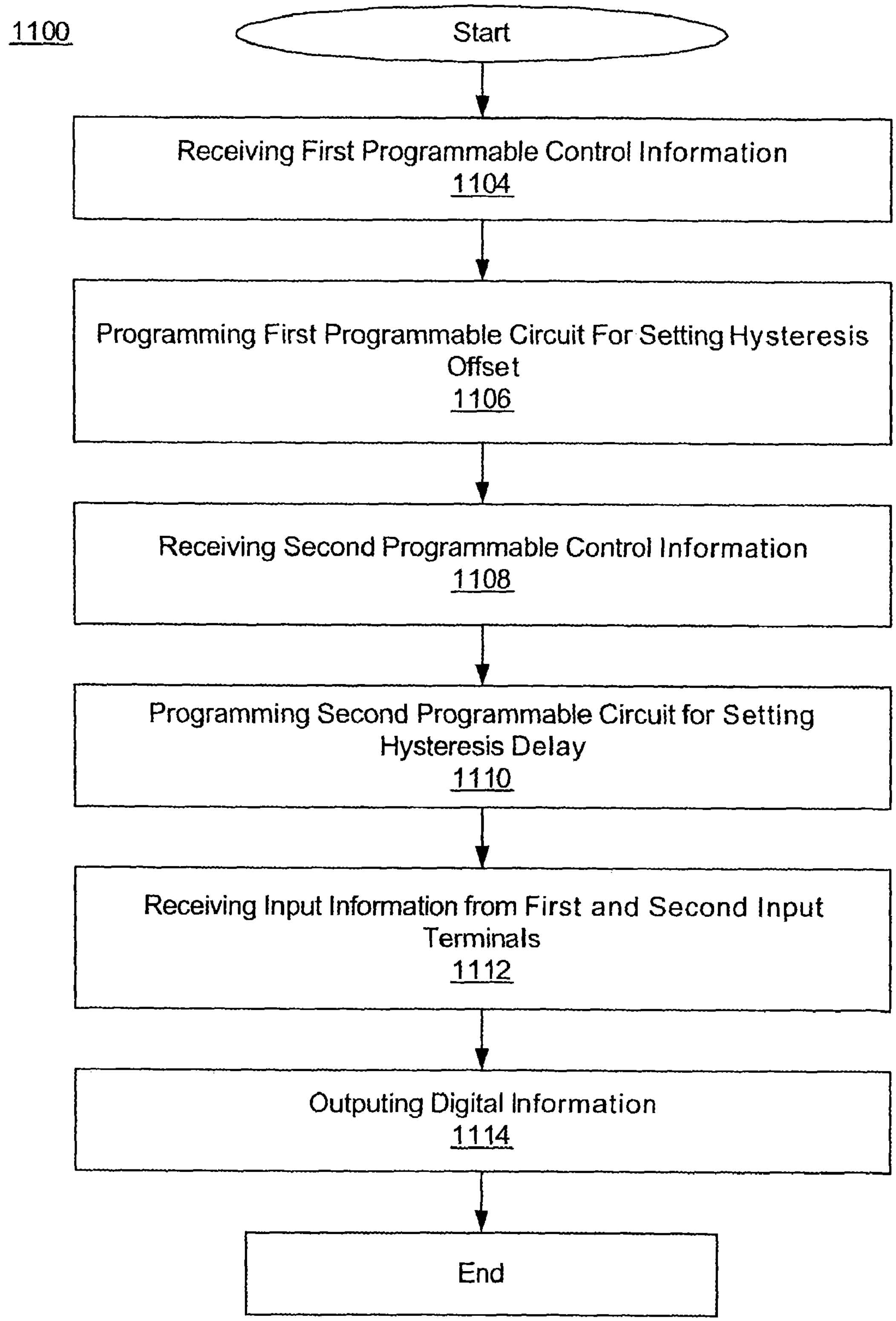
FIG. 11 is a flow chart illustrating a scheme of producing a digital output signal according to mixed input signals in accordance with one embodiment of the present invention.

FIG. 11 is a flow chart 110Q illustrating a scheme of producing a digital output signal in response to input signals with a hysteresis offset and a hysteresis delay in accordance with one embodiment of the present invention. At block 1104, the process receives first programmable control information, also known as programmable control signal, for selecting a hysteresis offset (or voltage). The first programmable control information, in one embodiment, includes multiple signals representing selecting information. The selecting information may be provided by a user, a processor within the system, and/or a pre-loaded memory device.

At block 1106, the process programs the first programmable circuit to set hysteresis offset in accordance to the first programmable control information. In one embodiment, every switcher, which could be a transistor, within the first programmable circuit is either set (open) or reset (closed) in response to the information provided by the first programmable control information. As discussed earlier, switchers control various current sources to implement the hysteresis offset voltage.

At block 1108, the process receives second programmable control information, also known as programmable control signal, for selecting a hysteresis delay. The second programmable control information, in one embodiment, includes multiple signals representing programming information. The programming information may be provided by a user, a processor within the system, and/or a pre-loaded non-volatile memory device.

At block 1110, the process programs the second programmable circuit to set hysteresis delay in accordance to the second programmable control information. In one embodiment, every switcher within the second programmable circuit is programmed. In other words, every switcher, which may be a transistor or an invertor, is either set (open) or reset (closed) in response to the information provided by the second programmable control information. As discussed earlier, switchers control various capacitors to create a hysteresis delay.

At block 1112, the process receives input information from a first and a second input terminal in response to the hysteresis offset and hysteresis delay. The processor will discard any input signal where its voltage amplitude is below the hysteresis offset and/or its pulse is shorter than the hysteresis delay. In one embodiment, the input signals can either be DC coupled or AC coupled. In another embodiment, the process is capable of detecting the voltage differences in millivolts.

At block 1114, the process produces digital output information in response to the input signals. In one embodiment, the output signal is a digital square waveform regardless of whether the input signals are DC or AC signals.

In the foregoing specification the invention has been described with reference to specific exemplary embodiments thereof. It will, however, be evident that various modifications and changes may be made thereto without departing from the broader scope of the invention. The specification and drawings are, accordingly, to be regarded in an illustrative rather than restrictive sense.

What is claimed is:

1. A comparator comprising:

a first input transistor with a first terminal, a second terminal and a gate terminal, wherein the gate terminal is in communication with a first input and the first terminal of the first input transistor is in communication with a first reference voltage via a first electrical path, the first electrical path including a first current source and a resistor to generate a hysteresis offset;

a second input transistor with a first terminal, a second terminal and a gate terminal, wherein the gate terminal is in communication with a second input and the first terminal of the second input transistor is in communication with the first reference voltage via a second electrical path;

a third transistor having a first terminal, a second terminal and a gate terminal, wherein the gate terminal communicates with said second terminal of said first input transistor;

a capacitor that communicates with said gate of said third transistor; and an output setting toward the first reference voltage when a first signal at the first input exceeds the hysteresis offset or a second reference voltage when the first signal at the first input does not exceed the hysteresis offset.

2. A comparator as in claim 1, wherein the hysteresis offset is controllable.

3. A comparator as in claim 2, wherein the amount of current generated by the current source is controllable, thereby affecting the hysteresis offset.

4. A comparator as in claim 1, wherein the first terminal of the third transistor is in communication with the first reference voltage via a third electrical path, the third electrical path including a current source.

5. A comparator as in claim 4, wherein the output of the comparator is located along the third electrical path between the first terminal of the third transistor and the current source.

6. A comparator as in claim 1 further comprising a switch that communicates with the capacitor.

7. A device comprising:

a first programmable circuit operable to selectively provide a hysteresis offset in response to a first programmable control signal;

a comparator circuit, responsive to the first programmable circuit, to receive a first and a second signals and compare the first signal and the second signal with applying the hysteresis offset to the second signal, wherein the comparator circuit provides a digital output signal in response to result of comparison; and a second programmable circuit in communication with the comparator circuit and operable to selectively provide a hysteresis delay in response to a second programmable control signal, wherein the comparator circuit compares the first signal and the second signal with applying the hysteresis delay, wherein the hysteresis delay and the hysteresis offset are independent of the digital output signal.

8. The device of claim 7, wherein the device is programmable by a user for boundary-scan testing.

9. The device of claim 7, wherein the first and second input signals are mixed signals.

10. The device of claim 7, wherein the first programmable circuit includes a programmable impedance element for selectively setting the hysteresis offset in response to the first programmable control signal.

11. The device of claim 7, wherein the first programmable circuit includes a programmable current source for selectively setting minimal voltage for input signals in response to the first programmable control signal.

12. The device of claim 11, wherein the programmable current source includes a plurality of selectable current sources.

13. The device of claim 7, wherein the second programmable circuit includes programmable capacitance element, wherein the programmable capacitance element selectively sets hysteresis delay for input signals.

14. The device of claim 13, wherein the programmable capacitance element includes a plurality of selectable capacitors and switchers, wherein the switchers are operable to receive the second programmable control signals.

15. A device comprising:

a first programmable circuit operable to selectively provide a hysteresis offset in response to a first programmable control signal;

a comparator circuit, responsive to the first programmable circuit, to receive a first and a second signals and compare the first signal and the second signal with applying the hysteresis offset to the second signal, wherein the comparator circuit provides a digital output signal in response to result of the comparison, wherein the hysteresis offset is independent of the digital output signal; and a second programmable circuit in communication with the comparator circuit and operable to selectively provide control of magnitude of the digital output signal.

16. A device comprising:

a first programmable circuit operable to selectively provide a hysteresis offset in response to a first programmable control signal:

a comparator circuit, responsive to the first programmable circuit, to receive a first and a second signals and compare the first signal and the second signal with applying the hysteresis offset to the second signal, wherein the comparator circuit provides a digital output signal in response to result of the comparison; and a second programmable circuit in communication with the comparator circuit and operable to selectively provide control of magnitude of the digital output signal, wherein the second programmable circuit further includes a plurality of selectable current sources.

17. A device comprising:

a first programmable circuit operable to selectively provide a hysteresis offset in response to a first programmable control signal;

a comparator circuit, responsive to the first programmable circuit, to receive a first and a second signals and compare the first signal and the second signal with applying the hysteresis offset to the second signal, wherein the comparator circuit provides a digital output signal in response to result of comparison, wherein the hysteresis offset is independent of the digital output signal; and a second programmable circuit in communication with the first programmable circuit and operable to selectively program an output current source for facilitating the digital output signal in response to a second programmable control signal.

18. A device comprising:

means for selectively providing a hysteresis offset in response to a first programmable control signal;

means for receiving a first and a second signals;

means for comparing the first signal and the second signal with applying the hysteresis offset to the second signal, wherein the means for comparing further includes means for providing a digital output signal in response to result of comparison; and means for selectively providing a hysteresis delay in response to a second programmable control signal, wherein the means for comparing further includes means for comparing the first signal and the second signal with applying the hysteresis delay the second signal, wherein the hysteresis delay and the hysteresis offset are independent of the digital output signal.

19. The device of claim 18, wherein the device includes means for receiving programmable information from a user for boundary-scan testing.

20. The device of claim 18, wherein the means for receiving a first and a second signals further includes means for receiving mixed signals.

21. The device of claim 18, wherein the means for selectively providing a hysteresis offset further includes means for selecting an impedance in response to the first programmable control signal.

22. The device of claim 18, wherein the means for selectively providing a hysteresis offset further includes means for selectively providing a programmable current source for setting minimal voltage for input signals in response to the first programmable control signal.

23. The device of claim 22, wherein the means for providing a programmable current source includes means for providing a plurality of selectable current sources.

24. The device of claim 18, wherein the means for selectively providing a hysteresis delay further includes means for selectively setting capacitance in response to the second programmable control signal.

25. The device of claim 24, wherein the means for selectively setting capacitance further includes means for activating one capacitor or a combination of a plurality of selectable capacitors.

26. A device comprising:

means for selectively providing a hysteresis offset in response to a first programmable control signal;

means for receiving a first and a second signals;

means for comparing the first signal and the second signal with applying the hysteresis offset to the second signal, wherein the means for comparing further includes means for providing a digital output signal in response to result of comparison, wherein the hysteresis offset is independent of the digital output signal; and means for selectively providing control to magnitude of the digital output signal in response to a second programmable control signal.

27. A device comprising:

means for selectively providing a hysteresis offset in response to a first programmable control signal;

means for receiving a first and a second signals;

means for comparing the first signal and the second signal with applying the hysteresis offset to the second signal, wherein the means for comparing further includes means for providing a digital output signal in response to result of comparison; and means for selectively providing control to magnitude of the digital output signal, wherein the means for selectively providing control to magnitude of the digital output signal includes means for selecting one current source or a combination of a plurality of selectable current sources.

28. A device comprising:

means for selectively providing a hysteresis offset in response to a first programmable control signal;

means for receiving a first and a second signals;

means for comparing the first signal and the second signal with applying the hysteresis offset to the second signal, wherein the means for comparing further includes means for providing a digital output signal in response to result of comparison, wherein the hysteresis offset is independent of the digital output signal; and means selectively programming an output current source for facilitating the digital output signal in response to a second programmable control signal.

29. A method for operating a comparator comprising:

a) receiving first programmable control information;

b) selectively setting a hysteresis offset in response to the first programmable control information;

c) receiving a first and a second input signals;

d) offsetting the second input signal with the hysteresis offset;

e) comparing the first input signal with the signal in step (d);

f) receiving second programmable control information;

g) selectively setting a hysteresis delay in response to the second programmable control information;

h) adjusting the second input signal in response to the hysteresis delay; and i) comparing the first input signal with the adjusted second input signal, wherein the hysteresis delay and the hysteresis offset are independent of an output of step (e).

30. The method of claim 29, wherein the method includes receiving first programmable control information from a user.

31. The method of claim 29, wherein receiving a first and a second input signals further includes receiving mixed signals.

32. The method of claim 29, wherein setting a hysteresis offset further includes selecting an impedance in response to the first programmable control information.

33. The method of claim 29, wherein setting a hysteresis offset further includes providing a programmable current source for selectively setting minimal voltage for input signals in response to the first programmable control information.

34. The method of claim 33, wherein the a programmable current source includes providing a plurality of selectable current sources.

35. The method of claim 29, wherein setting a hysteresis delay further includes selectively setting capacitance in response to the second programmable control information.

36. The method of claim 35, wherein the selectively setting capacitance further includes activating one capacitor or a combination of a plurality of selectable capacitors.

37. A method for operating a comparator comprising:

a) receiving first programmable control information;

b) selectively setting a hysteresis offset in response to the first programmable control information;

c) receiving a first and a second input signals;

d) offsetting the second input signal with the hysteresis offset;

e) comparing the first input signal with the signal in step (d), wherein the hysteresis offset is independent of a result of the comparing; and f) selectively providing control to magnitude of the digital output signal in response to a second programmable control information.

38. A method for operating a comparator comprising:

a) receiving first programmable control information;

b) setting a hysteresis offset in response to the first programmable control information;

c) receiving a first and a second input signals;

d) offsetting the second input signal with the hysteresis offset;

e) comparing the first input signal with the signal in step (d); and f) selectively providing control to magnitude of the digital output signal, wherein the selectively providing control to magnitude of the digital output signal includes selecting one current source or a combination of a plurality of selectable current sources.

39. A method for a comparator comprising:

a) receiving first programmable control information;

b) selectively setting a hysteresis offset in response to the first programmable control information;

c) receiving a first and a second input signals;

d) offsetting the second input signal with the hysteresis offset;

e) comparing the first input signal with the signal in step (d), wherein the hysteresis offset is independent of a result of the comparing; and f) selectively programming an output current source for facilitating the digital output signal in response to a second programmable control information.

40. A programmable comparator comprising:

a first programmable circuit operable to selectively provide a hysteresis delay in response to a first programmable control signal;

a comparator circuit, responsive to the first programmable circuit, to receive a first and a second input signals in response to the hysteresis delay and provide a digital output signal in response to result of comparison between the first and second input signals; and a second programmable circuit in communication with the comparator circuit and operable to selectively provide a hysteresis offset in response to a second programmable control signal, wherein the comparator circuit receives the first input signal and the second input signal in response to the hysteresis offset, wherein the hysteresis delay and the hysteresis offset are independent of the digital output signal.

41. The programmable comparator of claim 40, wherein the programmable comparator is programmable by a user.

42. The programmable comparator of claim 40, wherein the first and second input signals are mixed signals.

43. The programmable comparator of claim 40, wherein the second programmable circuit includes a programmable impedance element for selectively setting the hysteresis offset in response to the second programmable control signal.

44. The programmable comparator of claim 40, wherein the second programmable circuit includes a programmable current source for selectively setting minimal voltage for input signals in response to a first programmable circuit control signal.

45. The programmable of claim 44, wherein the programmable current source includes a plurality of selectable current sources.

46. The programmable comparator of claim 40, wherein the first programmable circuit includes programmable capacitance element, wherein the programmable capacitance element selectively sets the hysteresis delay for input signals based on said first programmable control signal.

47. The programmable comparator of claim 46, wherein the programmable capacitance element includes a plurality of selectable capacitors and switchers, wherein the switchers is operable to receive said first programmable control signal.

48. A programmable comparator comprising:

a first programmable circuit operable to selectively provide a hysteresis delay in response to a first programmable control signal;

a comparator circuit, responsive to the first programmable circuit, to receive a first and a second input signals in response to the hysteresis delay and provide a digital output signal in response to result of the comparison between the first and second input signals;

a second programmable circuit in communication with the comparator circuit and operable to selectively provide a hysteresis offset in response to a second programmable control signal, wherein the comparator circuit receives the first input signal and the second input signal in response to the hysteresis offset; and a third programmable circuit in communication with the comparator circuit and operable to selectively provide control to magnitude of the digital output signal in response to a third programmable control signal.

49. The programmable comparator of claim 48, wherein the third programmable circuit further includes a plurality of selectable current sources.

50. A programmable comparator comprising:

a first programmable circuit operable to selectively provide a hysteresis delay in response to a first programmable control signal;

a comparator circuit, responsive to the first programmable circuit, to receive a first and a second input signals in response to the hysteresis delay and provide a digital output signal in response to result of the comparison between the first and second input signals;

a second programmable circuit in communication with the comparator circuit and operable to selectively provide a hysteresis offset in response to a second programmable control signal, wherein the comparator circuit receives the first input signal and the second input signal in response to the hysteresis offset; and a third programmable circuit in communication with the comparator circuit and operable to programming an output transistor for facilitating the digital output signal in response to a third programmable control signal.

51. A programmable apparatus comprising:

means for selectively providing a hysteresis delay in response to a first programmable control signal;

means for receiving a first and a second input signals in response to the hysteresis delay;

means for comparing the first and second input signals and providing a digital output signal in response to result of comparison between the first and second input signals; and means for selectively providing a hysteresis offset in response to a second programmable control signal, wherein the means for receiving a first and a second input signals further includes means for receiving the first input signal and the second input signal in response to the hysteresis offset, wherein the hysteresis delay and the hysteresis offset are independent of the digital output signal.

52. The programmable apparatus of claim 51 further includes means for receiving the first and second programmable control signals from a user.

53. The programmable apparatus of claim 51, wherein the means for receiving a first and a second input signals further includes means for receiving mixed signals.

54. The programmable apparatus of claim 51, wherein means for selectively providing a hysteresis offset includes means for selectively setting the hysteresis offset in response to the second programmable control signal.

55. The programmable apparatus of claim 51, wherein means for selectively providing a hysteresis offset further includes means for selectively setting minimal voltage for input signals in response to the second programmable control signal.

56. The programmable apparatus of claim 55, wherein means for selectively setting minimal voltage for input signals further includes means for providing a plurality of selectable current sources.

57. The programmable apparatus of claim 51, wherein means for selectively providing a hysteresis delay includes means for selectively setting capacitance in response to the first programmable control signal.

58. The programmable apparatus of claim 57, wherein means for selectively setting capacitance includes means for selecting one capacitor or a combination of a plurality of selectable capacitors.

59. A programmable apparatus comprising:

means for selectively providing a hysteresis delay in response to a first programmable control signal;

means for receiving a first and a second input signals in response to the hysteresis delay;

means for comparing the first and second input signals and providing a digital output signal in response to result of comparison between the first and second input signals;

means for selectively providing a hysteresis offset in response to a second programmable control signal, wherein the means for receiving a first and a second input signals further includes means for receiving the first input signal and the second input signal in response to the hysteresis offset; and means for selectively providing control to magnitude of the digital output signal in response to a third programmable control signal.

60. The programmable apparatus of claim 59, wherein means for selectively providing control to magnitude of the digital output signal further includes means for selecting one current source or a combination of a plurality of selectable current sources.

61. A programmable apparatus comprising:

means for selectively providing a hysteresis delay in response to a first programmable control signal;

means for receiving a first and a second input signals in response to the hysteresis delay;

means for comparing the first and second input signals and providing a digital output signal in response to result of comparison between the first and second input signals;

means for selectively providing a hysteresis offset in response to a second programmable control signal, wherein the means for receiving a first and a second input signals further includes means for receiving the first input signal and the second input signal in response to the hysteresis offset; and means for selectively programming an output current source for facilitating the digital output signal in response to a third programmable control signal.

62. A method for comparing input signals comprising:

a) selectively providing a hysteresis delay in response to a first programmable control signal;

b) receiving a first and a second input signals in response to the hysteresis delay;

c) comparing the first and second input signals;

d) providing a digital output signal in response to result of comparison between the first and second input signals; and e) selectively providing a hysteresis offset in response to a second programmable control signal, wherein the receiving a first and a second input signals further includes receiving the first input signal and the second input signal in response to the hysteresis offset, wherein the hysteresis delay and the hysteresis offset are independent of a result of step (c).

63. The method of claim 62 further includes receiving the first and second programmable control signals from a user.

64. A method for comparing input signals comprising:

a) selectively providing a hysteresis delay in response to a first programmable control signal;

b) receiving a first and a second input signals in response to the hysteresis delay;

c) comparing the first and second input signals;

d) providing a digital output signal in response to result of comparison between the first and second input signals, wherein the receiving a first and a second input signals further includes receiving signals; and (e) selectively providing a hysteresis offset in response to a second programmable control signal, wherein the hysteresis delay and the hysteresis offset are independent of a result of step (c).

65. The method of claim 62, wherein the selectively providing a hysteresis offset further includes selectively setting minimal voltage for input signals in response to the second programmable control signal.

66. The method of claim 65, wherein the selectively setting minimal voltage for input signals further includes providing a plurality of selectable current sources.

67. The method of claim 62, wherein the selectively providing a hysteresis delay includes selectively setting capacitance in response to the first programmable control signal.

68. The method of claim 67, wherein the selectively setting capacitance includes selecting one capacitor or a combination of a plurality of selectable capacitors.

69. A method for comparing input signals comprising:

a) selectively providing a hysteresis delay in response to a first programmable control signal;

b) receiving a first and a second input signals in response to the hysteresis delay;

c) comparing the first and second input signals;

d) providing a digital output signal in response to result of comparison between the first and second input signals;

e) selectively providing a hysteresis offset in response to a second programmable control signal, wherein the receiving a first and a second input signals further includes receiving the first input signal and the second input signal in response to the hysteresis offset; and f) selectively providing control of magnitude of the digital output signal in response to a third programmable control signal.

70. The method of claim 69, wherein the selectively providing control of magnitude of the digital output signal further includes selecting one current source or a combination of a plurality of selectable current sources.

71. A method for comparing input signals comprising:

a) selectively providing a hysteresis delay in response to a first programmable control signal;

b) receiving a first and a second input signals in response to the hysteresis delay;

c) comparing the first and second input signals;

d) providing a digital output signal in response to result of comparison between the first and second input signals;

e) selectively providing a hysteresis offset in response to a second programmable control signal, wherein the receiving a first and a second input signals further includes receiving the first input signal and the second input signal in response to the hysteresis offset; and f) selectively programming an output current source for facilitating the digital output signal in response to a third programmable control signal.

72. A device comprising:

a first programmable circuit operable to selectively providing an output loading on an output circuit in response to a first programmable control signal;

a comparator circuit in communication with the first programmable circuit to compare a first input signal and a second input signal and provide a digital output signal in response to result of comparison and the output loading on the output circuit; and a second programmable circuit operable to selectively provide a hysteresis offset in response to a second programmable control signal, wherein the comparator circuit receives the first and the second input signals with applying the hysteresis offset, wherein the hysteresis offset is independent of the digital output signal.

73. A device comprising:

a first programmable circuit operable to selectively providing an output loading on an output circuit in response to a first programmable control signal;

a comparator circuit in communication with the first programmable circuit to compare a first input signal and a second input signal and provide a digital output signal in response to result of comparison and the output loading on the output circuit; and a second programmable circuit in communication with the comparator circuit and operable to selectively provide a hysteresis delay in response to a second programmable control signal, wherein the comparator circuit receives the first signal and the second signal with applying the hysteresis delay, and wherein the hysteresis delay is independent of the digital output signal.

74. The device of claim 72, wherein the device is programmable by a user.

75. The device of claim 72, wherein the first and second input signals are mixed signals.

76. The device of claim 72, wherein the second programmable circuit includes a programmable impedance element for selectively setting the hysteresis offset in response to the second programmable control signal.

77. The device of claim 72, wherein the second programmable circuit includes a programmable current source for selectively setting minimal voltage for input signals in response to the second programmable control signal.

78. The device of claim 77, wherein the programmable current source includes a plurality of selectable current sources.

79. The device of claim 73, wherein the third programmable circuit includes programmable capacitance element, wherein the programmable capacitance element selectively sets hysteresis delay for input signals.

80. The device of claim 79, wherein the programmable capacitance element includes a plurality of selectable capacitors and switchers, wherein the switchers is operable to receive second programmable control signals.

81. The device of claim 72, wherein the first programmable circuit selectively controls magnitude of the digital output signal.

82. The device of claim 81, wherein the first programmable circuit further includes a plurality of selectable current sources.

83. A device comprising:

means for selectively providing an output loading on an output circuit in response to a first programmable control signal;

means for comparing a first input signal and a second input signal and providing a digital output signal in response to result of comparison and the output loading on the output circuit; and means for selectively providing a hysteresis offset in response to a second programmable control signal, wherein means for comparing further includes means for receiving the first and the second input signals with applying the hysteresis offset, wherein the hysteresis offset is independent of the digital output signal.

84. A device comprising:

means for selectively providing an output loading on an output circuit in response to a first programmable control signal;

means for comparing a first input signal and a second input signal and providing a digital output signal in response to result of comparison and the output loading on the output circuit; and means for selectively providing a hysteresis delay in response to a second programmable control signal, wherein means for comparing further includes means for receiving the first signal and the second signal with applying the hysteresis delay, wherein the hysteresis delay is independent of the digital output signal.

85. The device of claim 83 further includes means for receiving the first and second programmable control signals from a user.

86. The device of claim 83, wherein means for receiving the first and second input signals further includes means for receiving mixed signals.

87. The device of claim 83, wherein means for selectively providing a hysteresis offset further includes means for selectively providing an impedance for setting the hysteresis offset in response to the second programmable control signal.

88. The device of claim 83, wherein means for selectively providing a hysteresis offset includes means for providing a programmable current source for selectively setting minimal voltage for input signals.

89. The device of claim 88, wherein means for providing a programmable current source includes means for providing a plurality of selectable current sources.

90. The device of claim 84, wherein means for selectively providing a hysteresis delay further includes means for selectively setting capacitance in response to a third programmable control signal.

91. The device of claim 90, wherein means for selectively setting capacitance further includes means for activating one capacitor or a combination of a plurality of selectable capacitors.

92. The device of claim 83, wherein means for selectively providing an output loading further includes means for selectively controlling magnitude of the digital output signal.

93. The device of claim 92, wherein means for selectively controlling magnitude of the digital output signal includes means for selecting one or a combination of a plurality of selectable current sources.

94. A method for performing a compare function comprising:

selectively providing an output loading on an output circuit in response to a first programmable control signal;

comparing a first input signal and a second input signal and providing a digital output signal in response to result of comparison and the output loading on the output circuit; and selectively providing a hysteresis offset in response to a second programmable control signal, wherein the comparing further includes receiving the first and the second input signals with applying the hysteresis offset, wherein the hysteresis offset is independent of the digital output signal.

95. A method for performing a compare function comprising:

selectively providing an output loading on an output circuit in response to a first programmable control signal;

comparing a first input signal and a second input signal and providing a digital output signal in response to result of comparison and the output loading on the output circuit; and selectively providing a hysteresis delay in response to a second programmable control signal, wherein the comparing further includes receiving the first signal and the second signal with applying the hysteresis delay, wherein the hysteresis delay is independent of the digital output signal.

96. The method of claim 94 further includes receiving the first and second programmable control signals from a user.

97. The method of claim 94, wherein the receiving the first and second input signals further includes receiving mixed signals.

98. The method of claim 94, wherein the selectively providing a hysteresis offset further includes selectively providing an impedance for setting the hysteresis offset in response to the second programmable control signal.

99. The method of claim 94, wherein the selectively providing a hysteresis offset includes providing a programmable current source for selectively setting minimal voltage for input signals.

100. The method of claim 99, wherein the providing a programmable current source further includes providing a plurality of selectable current sources.

101. The method of claim 95, wherein the selectively providing a hysteresis delay further includes selectively setting capacitance in response to a third programmable control signal.

102. The method of claim 101, wherein the selectively setting capacitance further includes activating one capacitor or a combination of a plurality of selectable capacitors.

103. The method of claim 94, wherein the selectively providing an output loading further includes selectively controlling magnitude of the digital output signal.

104. The method of claim 103, wherein the selectively controlling magnitude of the digital output signal includes selecting one or a combination of a plurality of selectable current sources.

105. A device comprising:

a hysteresis offset circuit that selectively generates a hysteresis offset;

a hysteresis delay in response to a first programmable control signal circuit that selectively generates a hysteresis delay in response to a second programmable control signal; and a comparator circuit that receives first and second input signals and communicates with said hysteresis offset circuit and said hysteresis delay circuit, that generates a first output signal when said first input signal exceeds said second input signal plus said hysteresis offset for a period greater than said hysteresis delay, and that generates a second output signal when at least one of said first input signal does not exceed said second input signal plus said hysteresis offset and/or when said first input signal does not exceed said second input signal plus said hysteresis offset for said period, wherein the hysteresis delay and the hysteresis offset are independent of the first and second signals.

106. A device comprising:

a hysteresis offset circuit that selectively generates a hysteresis offset in response to a first programmable control signal;

a hysteresis delay circuit that selectively generates a hysteresis delay in response to a second programmable control signal; and a comparator circuit that receives first and second input signals and communicates with said hysteresis offset circuit and said hysteresis delay circuit, that generates a first output signal when said first input signal exceeds said second input signal plus said hysteresis offset for a period greater than said hysteresis delay, and that generates a second output signal when at least one of said first input signal does not exceed said second input signal plus said hysteresis offset and/or when said first input signal does not exceed said second input signal plus said hysteresis offset for said period, wherein said comparator circuit includes an output circuit and further comprising an output loading circuit that communicates with said output circuit and that adjusts output loading of said output circuit in response to a third programmable control signal.

107. A device comprising:

a hysteresis offset circuit that selectively generates a hysteresis offset in response to a first programmable control signal;

an output loading circuit that selectively generates an output loading adjustment in response to a second programmable control signal;

a comparator circuit that receives first and second input signals, communicates with said hysteresis offset circuit and includes an output circuit that communicates with said output loading circuit; and a hysteresis delay circuit that selectively generates a hysteresis delay in response to a third programmable control signal, wherein said comparator circuit generates one of first or second output signals based on said first input signal, said second input signal, said hysteresis offset, said output loading adjustment and said hysteresis delay.

108. A device comprising:

a hysteresis delay circuit that selectively generates a hysteresis delay in response to a first programmable control signal;

an output loading circuit that selectively generates an output loading adjustment in response to a second programmable control signal; and a comparator circuit that receives first and second input signals, communicates with said hysteresis delay circuit and includes an output circuit that communicates with said output loading circuit, that generates one of a first output signal or a second output signal based on said first input signal, said second input signal, said hysteresis delay and said output loading adjustment, wherein the hysteresis delay is independent of the digital output signal.

109. A device comprising:

a hysteresis delay circuit that selectively generates a hysteresis delay in response to a first programmable control signal;

an output loading circuit that selectively generates an output loading adjustment in response to a second programmable control signal;

a comparator circuit that receives first and second input signals, communicates with said hysteresis delay circuit and includes an output circuit that communicates with said output loading circuit; and a hysteresis offset circuit that selectively generates a hysteresis offset in response to a third programmable control signal, wherein said comparator circuit generates one of first or second output signals based on said first input signal, said second input signal, said hysteresis delay, said output loading adjustment and said hysteresis offset.

110. A device comprising:

a hysteresis offset circuit that selectively generates a hysteresis offset in response to a first programmable control signal;

a hysteresis delay circuit that selectively generates a hysteresis delay in response to a second programmable control signal; and a comparator circuit that receives first and second input signals and communicates with said hysteresis offset circuit and said hysteresis delay circuit, that generates one of a first output signal or a second output signal based on said first input signal, said second input signal, said hysteresis offset and said hysteresis delay, wherein the hysteresis delay and the hysteresis offset are independent of the first and second output signals.

111. A device comprising:

a hysteresis offset circuit that selectively generates a hysteresis offset in response to a first programmable control signal;

a hysteresis delay circuit that selectively generates a hysteresis delay in response to a second programmable control signal;

a comparator circuit that receives first and second input signals and communicates with said hysteresis offset circuit and said hysteresis delay circuit, wherein said comparator circuit includes an output circuit; and an output loading circuit that selectively generates an output loading adjustment in response to a third programmable control signal, wherein said comparator circuit generates one of first or second output signals based on said first input signal, said second input signal, said hysteresis offset, said hysteresis delay and said output loading adjustment.

112. A device comprising:

hysteresis offset means for selectively generating a hysteresis offset in response to a first programmable control signal;

hysteresis delay means for selectively in response to a second programmable control signal generating a hysteresis delay; and comparator means that receives first and second input signals and communicates with said hysteresis offset means and said hysteresis delay means, for generating a first output signal when said first input signal exceeds said second input signal plus said hysteresis offset for a period greater than said hysteresis delay, and for generating a second output signal when at least one of said first input signal does not exceed said second input signal plus said hysteresis offset and/or when said first input signal does not exceed said second input signal plus said hysteresis offset for said period, wherein the hysteresis delay and the hysteresis offset are independent of the first and second output signals.

113. A device comprising:

hysteresis offset means for selectively generating a hysteresis offset in response to a first programmable control signal;

hysteresis delay means for selectively generating a hysteresis delay in response to a second programmable control signal; and comparator means that receives first and second input signals and communicates with said hysteresis offset means and said hysteresis delay means, for generating a first output signal when said first input signal exceeds said second input signal plus said hysteresis offset for a period greater than said hysteresis delay, and for generating a second output signal when at least one of said first input signal does not exceed said second input signal plus said hysteresis offset and/or when said first input signal does not exceed said second input signal plus said hysteresis offset for said period, wherein said comparator means includes output means for outputting one of said first or second output signals based on an output loading adjustment and further comprising output loading means that selectively generates said output loading adjustment in response to a third programmable control signal.

114. A device comprising:

hysteresis offset means for selectively generating a hysteresis offset in response to a first programmable control signal;

output loading means for selectively generating an output loading adjustment in response to a second programmable control signal;

comparator means for receiving first and second input signals, communicating with said hysteresis offset means and including output means for communicating with said output loading means; and hysteresis delay means for selectively generating a hysteresis delay in response to a third programmable control signal, wherein said comparator means generates one of said first or second output signals based on said first input signal, said second input signal, said hysteresis offset, said output loading adjustment and said hysteresis delay.

115. A device comprising:

hysteresis delay means for selectively generating a hysteresis delay in response to a first programmable control signal;

output loading means for selectively generating an output loading adjustment in response to a second programmable control signal; and comparator means, that receives first and second input signals, communicates with said hysteresis delay means and includes output means that communicates with said output loading means, for generating one of a first output signal or a second output signal based on said first input signal, said second input signal, said hysteresis delay and said output loading adjustment, wherein the hysteresis delay is independent of the first and second output signals.

116. A device comprising:

hysteresis delay means for selectively generating a hysteresis delay in response to a first programmable control signal;

output loading means for selectively generating an output loading adjustment in response to a second programmable control signal;

comparator means for receiving first and second input signals, communicating with said hysteresis delay means and including output means for communicating with said output loading means; and hysteresis offset means for generating a hysteresis offset, wherein said comparator means generates one of said first or second output signals based on said first input signal, said second input signal, said hysteresis delay, said output loading adjustment and said hysteresis offset.

117. A device comprising:

hysteresis offset means for selectively generating a hysteresis offset in response to a first programmable control signal;

hysteresis delay means for selectively generating a hysteresis delay in response to a second programmable control signal; and comparator means, that receives first and second input signals and communicates with said hysteresis offset means and said hysteresis delay means, for generating one of a first output signal or a second output signal based on said first input signal, said second input signal, said hysteresis offset and said hysteresis delay, wherein the hysteresis delay and the hysteresis offset are independent of the first and second output signals.

118. A device comprising:

hysteresis offset means for selectively generating a hysteresis offset in response to a first programmable control signal;

hysteresis delay means for selectively generating a hysteresis delay in response to a second programmable control signal;

comparator means that receiving first and second input signals and communicating with said hysteresis offset means and said hysteresis delay means, wherein said comparator means includes output means for outputting said first output signal or said second output signal based on an output loading adjustment; and output loading means for selectively generating said output loading adjustment in response to a third programmable control signal, wherein said comparator means generates one of said first or second output signals based on said first input signal, said second input signal, said hysteresis offset, said hysteresis delay and said output loading adjustment.

119. A method comprising:

selectively generating a hysteresis offset in response to a first programmable control signal;

selectively generating a hysteresis delay in response to a second programmable control signal;

generating a first output signal when said first input signal exceeds said second input signal plus said hysteresis offset for a period greater than or equal to said hysteresis delay; and generating a second output signal when at least one of said first input signal does not exceed said second input signal plus said hysteresis offset and/or when said first input signal does not exceed said second input signal plus said hysteresis offset for said period, wherein the hysteresis delay and the hysteresis offset are independent of the first and second output signals.

120. A method comprising:

selectively generating a hysteresis offset in response to a first programmable control signal;

selectively generating a hysteresis delay in response to a second programmable control signal;

generating a first output signal when said first input signal exceeds said second input signal plus said hysteresis offset for a period greater than or equal to said hysteresis delay;

generating a second output signal when at least one of said first input signal does not exceed said second input signal plus said hysteresis offset and/or when said first input signal does not exceed said second input signal plus said hysteresis offset for said period; and adjusting output loading.

121. A method comprising:

selectively setting a hysteresis offset in response to a first programmable control signal;

selectively setting an output loading adjustment in response to a second programmable control signal:

generating one of a first output signal or a second output signal based on a first input signal, a second input signal, said hysteresis offset and said output loading adjustment;

selectively setting a hysteresis delay in response to a third programmable control signal; and generating one of said first or second output signals based on a first input signal, a second input signal, said hysteresis offset, said output loading adjustment and said hysteresis delay.

122. A method comprising:

selectively setting a hysteresis delay in response to a first programmable control signal;

selectively setting an output loading adjustment in response to a second programmable control signal; and generating one of a first output signal or a second output signal based on a first input signal, a second input signal, said hysteresis delay and said output loading adjustment, wherein the hysteresis delay is independent of the first and second output signals.

123. A method comprising:

selectively setting a hysteresis delay in response to a first programmable control signal;

selectively setting an output loading adjustment in response to a second programmable control signal;

generating one of a first output signal or a second output signal based on a first input signal, a second input signal, the hysteresis delay and the output loading adjustment;

selectively setting a hysteresis offset in response to a third programmable control signal; and generating one of said first or second output signals based on said first input signal, said second input signal, said hysteresis delay, said output loading adjustment and said hysteresis offset.

124. A method comprising:

selectively setting a hysteresis offset in response to a first programmable control signal;

selectively setting a hysteresis delay in response to a second programmable control signal; and generating one of a first output signal or a second output signal based on a first input signal, a second input signal, said hysteresis offset and said hysteresis delay, wherein the hysteresis delay and the hysteresis offset are independent of the first and second output signals.

125. A method comprising:

selectively setting a hysteresis offset in response to a first programmable control signal;

selectively setting a hysteresis delay in response to a second programmable control signal;

generating one of a first output signal or a second output signal based on a first input signal, a second input signal, said hysteresis offset and said hysteresis delay;

selectively setting an output loading adjustment in response to a third programmable control signal; and generating one of said first or second output signals based on said first input signal, said second input signal, said hysteresis offset, said hysteresis delay and said output loading adjustment.

* * * * *

UNITED STATES PATENT AND TRADEMARK OFFICE

CERTIFICATE OF CORRECTION

PATENT NO. : 6,982,582 B1
APPLICATION NO. : 10/602997
DATED : January 3, 2006
INVENTOR(S) : Yi Cheng It is certified that error appears in the above-identified patent and that said Letters Patent is hereby corrected as shown below:

IN THE PATENT:

| | |
|---|---|
| Column 6, Line 46: | Delete "12" and insert --$I_2$-- |
| Column 9, Line 53 | Delete "860" and insert --$860_1$-- |
| Column 10, Line 11 | Delete "8401" and insert --$840_1$-- |
| Column 11, Line 11 | Delete "110Q" and insert --1100-- |
| Column 14, Line 14 | Insert --to-- after "delay" |
| Column 15, Line 49 | Delete "a" after "the" |
| Column 16, Line 62 | Insert --comparator-- after "programmable" |
| Column 23, Line 7 | Insert --in response to a first programmable control signal-- after "offset" |
| Column 23, Line 8 | Delete "in response to a first programmable control signal" after "delay" |
| Column 25, Line 5 | Delete "generating" after "signal" and insert after "selectively" |
| Column 26, Line 24 | Insert --selectively-- before "generating" |
| Column 26, Line 24 | Insert --in response to a third programmable control signal-- after "offset" |
| Column 26, Line 52 | Delete "that" and insert --for-- |
| Column 27, Line 28 | Insert -- selectively-- before "adjusting" |
| Column 27, Line 28 | Insert --in response to a third programmable control signal-- after "loading" |

Signed and Sealed this

Fifth Day of September, 2006

JON W. DUDAS

*Director of the United States Patent and Trademark Office*